United States Patent
Aonuma et al.

(10) Patent No.: US 9,054,316 B2
(45) Date of Patent: Jun. 9, 2015

(54) METHOD OF MANUFACTURING ORGANIC EL ELEMENT AND ORGANIC EL ELEMENT

(71) Applicant: Panasonic Corporation, Osaka (JP)

(72) Inventors: Masaki Aonuma, Fukuoka (JP); Takuya Satoh, Kyoto (JP); Yoichiro Yashiro, Osaka (JP)

(73) Assignee: JOLED INC., Tokyo (JP)

( * ) Notice: Subject to any disclaimer, the term of this patent is extended or adjusted under 35 U.S.C. 154(b) by 0 days.

(21) Appl. No.: 14/008,636

(22) PCT Filed: Nov. 8, 2012

(86) PCT No.: PCT/JP2012/007153
§ 371 (c)(1),
(2) Date: Sep. 30, 2013

(87) PCT Pub. No.: WO2013/118210
PCT Pub. Date: Aug. 15, 2013

(65) Prior Publication Data
US 2014/0077188 A1 Mar. 20, 2014

(30) Foreign Application Priority Data
Feb. 8, 2012 (JP) .................................. 2012-025209

(51) Int. Cl.
*H01L 51/52* (2006.01)
*H01L 51/00* (2006.01)
(Continued)

(52) U.S. Cl.
CPC ............ *H01L 51/0021* (2013.01); *H05B 33/26* (2013.01); *C23C 14/086* (2013.01); *H01L 51/5234* (2013.01); *H01L 2251/308* (2013.01); *H01L 51/56* (2013.01); *C23C 14/352* (2013.01)

(58) Field of Classification Search
CPC . H01L 51/0021; H01L 51/56; H01L 51/5231; H01L 51/5234; C23C 14/086; C23C 14/35
USPC ........................................ 438/99, 584; 257/40
See application file for complete search history.

(56) References Cited

U.S. PATENT DOCUMENTS

| 5,443,922 A | 8/1995 | Nishizaki et al. |
| 6,280,861 B1 | 8/2001 | Hosokawa et al. |

(Continued)

FOREIGN PATENT DOCUMENTS

| JP | 05-163488 | 6/1993 |
| JP | 08-180748 | 7/1996 |

(Continued)

OTHER PUBLICATIONS

International Search Report, mailed Feb. 19, 2013 in corresponding International Application No. PCT/JP2012/007153.

*Primary Examiner* — Allan R Wilson
(74) *Attorney, Agent, or Firm* — Greenblum & Bernstein, P.L.C.

(57) ABSTRACT

A method of manufacturing an organic EL element includes: a first step of forming a lower electrode on a substrate; a second step of forming an organic functional layer on the lower electrode; and a third step of forming an upper electrode on the organic functional layer, wherein the third step includes: a first film-forming step of forming a thin film on the organic functional layer by magnetron sputtering, the thin film being formed of material of the upper electrode; and a second film-forming step of forming, after the first film-forming step, another thin film by a film-forming process different from the magnetron sputtering on the thin film formed in the first film-forming step, said another thin film being formed of the material of the upper electrode.

6 Claims, 17 Drawing Sheets

(51) Int. Cl.
*C23C 14/08* (2006.01)
*H01L 51/56* (2006.01)
*C23C 14/35* (2006.01)
*H05B 33/26* (2006.01)

(56) References Cited

U.S. PATENT DOCUMENTS

| | | | |
|---|---|---|---|
| 6,284,393 | B1 | 9/2001 | Hosokawa et al. |
| 8,400,054 | B2 * | 3/2013 | Dobbertin et al. ............. 313/504 |
| 2002/0109458 | A1 * | 8/2002 | Pichler et al. ................. 313/504 |
| 2004/0004214 | A1 * | 1/2004 | Yamazaki et al. .............. 257/40 |
| 2007/0015429 | A1 | 1/2007 | Maeda et al. |
| 2007/0048892 | A1 * | 3/2007 | Wadell et al. .................. 438/82 |
| 2008/0315763 | A1 * | 12/2008 | Dobbertin et al. ............ 313/512 |
| 2010/0181557 | A1 * | 7/2010 | Sun ................................ 257/40 |
| 2013/0256639 | A1 * | 10/2013 | Kambe et al. ................... 257/40 |

FOREIGN PATENT DOCUMENTS

| | | |
|---|---|---|
| JP | 10-294182 | 11/1998 |
| JP | 2000-276950 | 10/2000 |
| JP | 2002-100483 | 4/2002 |
| JP | 2004-014287 | 1/2004 |
| JP | 2007-026852 | 2/2007 |
| JP | 2007-095338 | 4/2007 |
| JP | 2013-004368 | 1/2013 |
| WO | 97/46054 | 12/1997 |

* cited by examiner

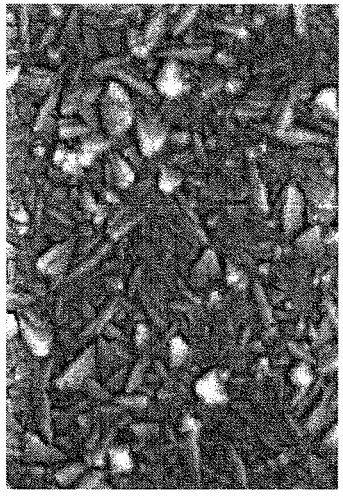
FIG. 14C Frequency 250→350kHz
FIG. 14F Pressure 0.6→0.2Pa
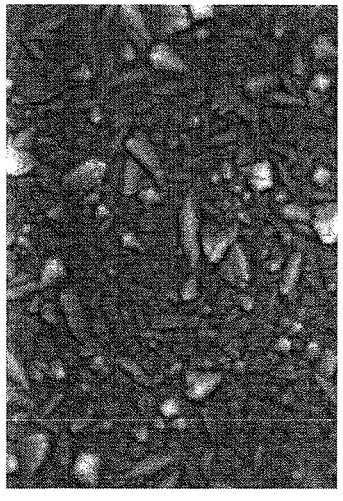
FIG. 14B DUTY 73%→60%
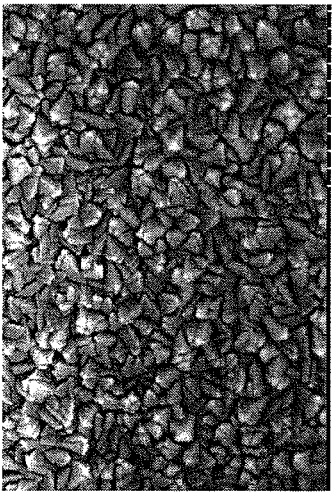
FIG. 14E Film-forming power 2.5kw→1.25kw
FIG. 14A Normal
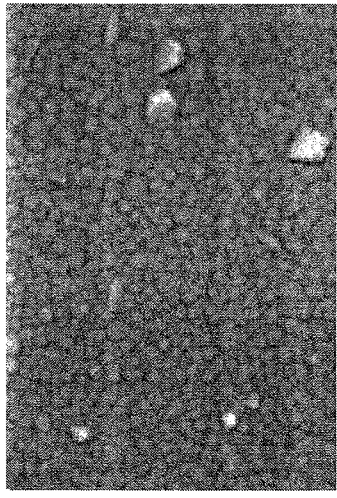
FIG. 14D O2 flow rate 1.5→3.0sccm

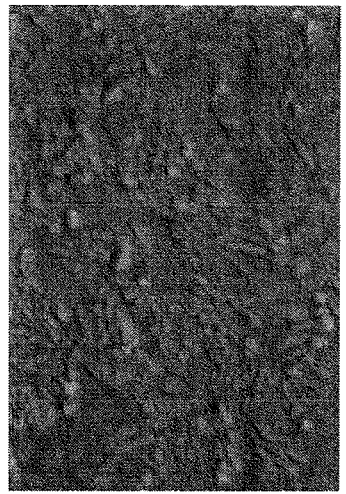
FIG. 15C Frequency 250→100kHz
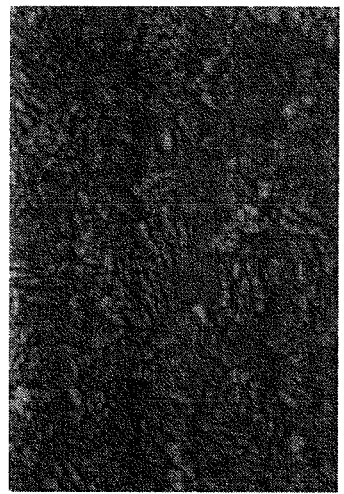
FIG. 15F Pressure 0.6→0.5Pa
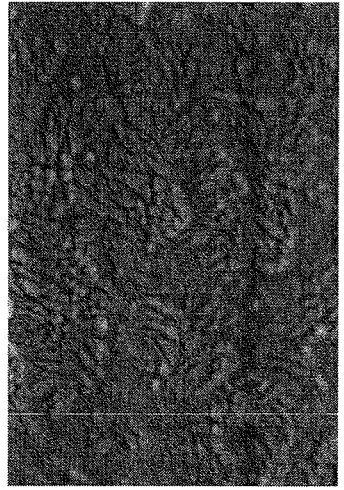
FIG. 15B DUTY 73%→60%
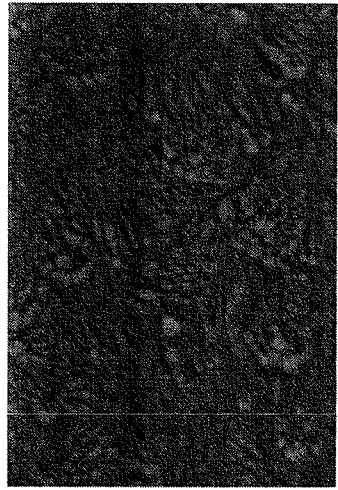
FIG. 15E Film-forming power 5.4kw→2.7kw
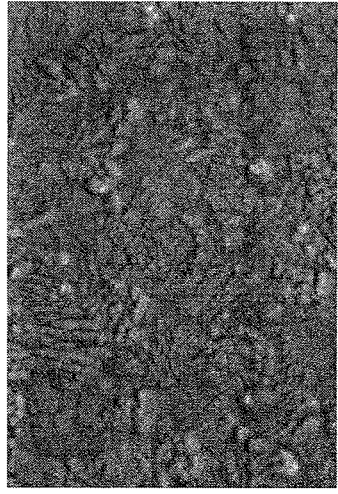
FIG. 15A Normal
FIG. 15D O2 flow rate 10→15sccm

METHOD OF MANUFACTURING ORGANIC EL ELEMENT AND ORGANIC EL ELEMENT

TECHNICAL FIELD

The present invention relates to a method of manufacturing an organic EL element and an organic EL element, and in particular to a technology for forming an electrode of an organic EL element.

BACKGROUND ART

In recent years, more attention has been given to organic EL elements using the phenomenon of electroluminescence occurring in organic material. An organic EL element includes organic functional layers inserted between an upper electrode and a lower electrode, and is manufactured by layering the lower electrode, one or more organic functional layers, and the upper electrode in this order on a substrate.

There have been known various formation methods for the lower electrode, the organic functional layers and the upper electrode. In order to form the upper electrode, film-forming methods such as a sputtering method, a vapor deposition method, a spray method, and a chemical vapor deposition (CVD) method are used. In particular, Patent Literature 1 discloses a technology for forming the upper electrode by a facing target sputtering method.

CITATION LIST

Patent Literature

[Patent Literature 1]
Japanese Patent Application Publication No. 2007-95338

SUMMARY OF INVENTION

Technical Problem

In order to manufacture a high efficiency, long life organic EL element, the upper electrode needs to achieve excellent injection to the organic functional layer. However, the upper electrode formed by a conventional method such as the facing target sputtering method does not exhibit high injection performance.

In addition, in the manufacturing of the upper electrode, a high membrane stress might remain on the upper electrode. This might cause peeling and cracking of the upper electrode and reduce yields.

The present invention has been achieved in view of the above problems, and an aim thereof is to provide a method of manufacturing an organic EL element that has less peeling and cracking of the upper electrode, and that achieves excellent injection from the upper electrode to the organic functional layers.

Solution to Problem

In order to achieve the above aims, one aspect of the present invention provides a method of manufacturing an organic EL element comprising: a first step of forming a lower electrode on a substrate; a second step of forming an organic functional layer on the lower electrode; and a third step of forming an upper electrode on the organic functional layer, wherein the third step includes: a first film-forming step of forming a thin film on the organic functional layer by magnetron sputtering, the thin film being formed of material of the upper electrode; and a second film-forming step of forming, after the first film-forming step, another thin film by a film-forming process different from the magnetron sputtering on the thin film formed in the first film-forming step, said another thin film being formed of the material of the upper electrode.

Advantageous Effects of Invention

It is possible to form an electrode thin film achieving excellent injection to the organic functional layer on the organic functional layers by the magnetron sputtering method.

In the magnetron sputtering method, high energy sputtered particles bombard the growth surface of the thin film. Therefore, the membrane stress of the thin film formed by the magnetron sputtering method is usually highest among various film-forming methods. That is, the electrode thin film formed by the magnetron sputtering method has a high membrane stress. It is possible to form an electrode thin film having a low membrane stress by using a method different from the magnetron sputtering method on the electrode thin film that has been formed by the magnetron sputtering method. This leads to the reduction of the membrane stress per unit film thickness of the whole upper electrode.

Thus, the method described above realizes the upper electrode achieving excellent injection to the organic functional layers and reduced membrane stress, and it is therefore possible to reduce the occurrence of peeling and cracking of the upper electrode, and to manufacture a high efficiency, long life organic EL element.

BRIEF DESCRIPTION OF DRAWINGS

FIGS. 14A-14F show SEM images of ITO films formed by a facing target sputtering method.

FIGS. 15A-15F show SEM images of ITO films formed by a magnetron sputtering method.

DESCRIPTION OF EMBODIMENTS

Figure 1:
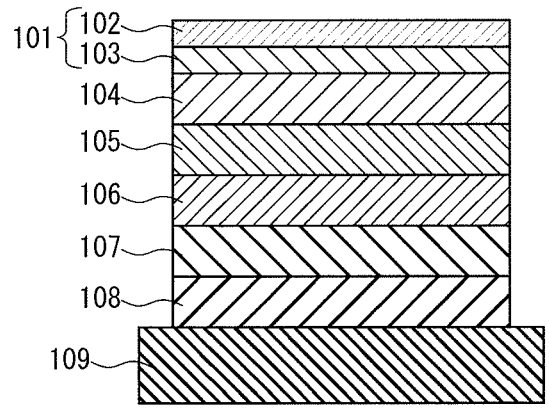
FIG. 1 is a cross-sectional view showing an example of the structure of an organic EL element 100.

Outline of Aspects of the Present Invention

One aspect of the present invention provides a method of manufacturing an organic EL element comprising: a first step of forming a lower electrode on a substrate; a second step of forming an organic functional layer on the lower electrode; and a third step of forming an upper electrode on the organic functional layer, wherein the third step includes: a first film-forming step of forming a thin film on the organic functional layer by magnetron sputtering, the thin film being formed of material of the upper electrode; and a second film-forming step of forming, after the first film-forming step, another thin film by a film-forming process different from the magnetron sputtering on the thin film formed in the first film-forming step, said another thin film being formed of the material of the upper electrode.

In this aspect of the method of manufacturing the organic EL element pertaining to the present invention, the film-forming process different from the magnetron sputtering is a process to form a thin film having a lower membrane stress than a thin film formed by the magnetron sputtering.

In this aspect of the method of manufacturing the organic EL element pertaining to the present invention, the film-forming process different from the magnetron sputtering is selected from a group consisting of facing targets sputtering, resistance heating deposition, electron beam deposition, CVD, ion plating and plasma deposition.

In this aspect of the method of manufacturing the organic EL element pertaining to the present invention, in the first film-forming step, a film-forming power density of the magnetron sputtering is no less than 4.5 W/cm$^2$ and no greater than 9 W/cm$^2$.

In this aspect of the method of manufacturing the organic EL element pertaining to the present invention, the upper electrode is a cathode, the lower electrode is an anode, the organic functional layer is composed of a plurality of layers including an electron transport layer, and in the third step, the cathode is formed of light-transmissive conductive material on the electron transport layer.

In this aspect of the method of manufacturing the organic EL element pertaining to the present invention, the light-transmissive conductive material is selected from a group consisting of ITO, IZO, ZnO and TiO2.

Another aspect of the present invention provides an organic EL element having a pair of electrodes and an organic functional layer disposed therebetween, the pair of electrodes consisting of an upper electrode and a lower electrode, wherein the upper electrode includes a first layer and a second layer, the first layer being in contact with the organic functional layer, the second layer being in contact with the first layer, and the first layer has a higher membrane stress than the organic functional layer and the second layer.

Yet another aspect of the present invention provides an organic EL element having a pair of electrodes and an organic functional layer disposed therebetween, the pair of electrodes consisting of an upper electrode and a lower electrode, wherein the upper electrode includes a first layer and a second layer, the first layer being in contact with the organic functional layer, the second layer being in contact with the first layer, the first layer has a crystalline structure, and the second layer has a non-crystalline structure.

EMBODIMENTS

Embodiment 1

Structure of Organic EL Element

First, description is made on the structure of an organic EL element pertaining to Embodiment 1. FIG. 1 is a cross-sectional view showing an example of the structure of an organic EL element 100 pertaining to Embodiment 1. As shown in FIG. 1, the organic EL element 100 includes a cathode 101, an electron transport layer 104, a light-emitting layer 105, a hole transport layer 106, a hole injection layer 107, an anode 108, and a substrate 109. Further, the cathode 101 is composed of a first cathode layer 102 and a second cathode layer 103. The following describes each component.

<Cathode>

The cathode 101 injects electrons to the electron transport layer 102. The cathode 101 is made of ITO (indium tin oxide), IZO (indium zinc oxide), ZnO (zinc oxide), TiO$_2$ (titanium oxide), Ag (silver), Al (aluminum), silver-palladium-copper alloy, silver-rubidium-gold alloy, MoCr (molybdenum-chrome alloy), NiCr (nickel-chrome alloy), or the like.

In a top emission type organic EL element that emits light from a surface closer to the cathode, the cathode is made of light-transmissive material such as ITO, IZO, ZnO and TiO$_2$.

Here, the cathode 101 is composed of a first cathode layer 102 and a second cathode layer 103. The first cathode layer 102 and the second cathode layer 103 are formed by different methods, and have different crystalline structures and membrane stresses. The first cathode layer 102 and the second cathode layer 103 are described in detail later.

The first cathode layer 102 is disposed to increase adhesion between the cathode 101 and the electron transport layer 104, and to improve electron injection performance from the cathode 101 to the electron transport layer 104. To be specific, the first cathode layer 102 is an electrode film formed by the magnetron sputtering method. By employing the magnetron sputtering method, it is possible to form an electrode thin film having high adhesion to the electron transport layer as the underlayer, and excellent electron injection characteristics.

On the other hand, in the magnetron sputtering method, high energy sputtered particles bombard the growth surface of a film, and therefore, the first cathode layer 102 has a high membrane stress, which is higher than the electron transport layer 104 as the underlayer.

The second cathode layer 103 is disposed to reduce the membrane stress of the cathode 101. To be specific, the second cathode layer 103 is formed by a film-forming method different from the magnetron sputtering method, e.g., by the facing target sputtering method, and has the membrane stress lower than the first cathode layer.

The membrane stress is classified into compressive stress and tensile stress. The thin film formed by the magnetron sputtering method generally shows the compressive stress. That is, the second cathode layer 103 has a lower compressive stress than the first cathode layer.

The cathode 101 has increased adhesion to the electron transport layer and reduced membrane stress by thus disposing the first cathode layer 102 having the membrane stress higher than the electron transport layer 104 as the underlayer and high adhesion to the underlayer on the electron transport layer 104, and by thus disposing the second cathode layer 103 having a low membrane stress on the first cathode layer 102. Since the cathode 101 has high adhesion to the electron transport layer 104, the cathode 101 exhibits high electron injection to the electron transport layer 104. Further, the membrane stress per unit film thickness of the cathode 101 is reduced, and accordingly, the occurrence of peeling and cracking of the cathode 101 is reduced.

<Electron Transport Layer>

The electron transport layer 104 transports electrons injected from the cathode 101 to the light-emitting layer 105. The electron transport layer 104 is made of material such as a nitro-substituted fluorenone derivative, a thiopyran dioxide derivative, a diphenylquinone derivative, a perylene tetracarboxyl derivative, an anthraquinodimethane derivative, a fluoronylidene methane derivative, an anthrone derivative, an oxadiazole derivative, a perinone derivative, and a quinolone complex derivative (each listed in Japanese Patent Application Publication No. H5-163488), a phosphorus oxide derivative, a triazole derivative, a triazine derivative, a silole derivative, a dimesitylboron derivative, and a triarylboron derivative.

<Light-emitting Layer>

The light-emitting layer 105 is a layer that emits light by recombination of carriers (holes and electrons). The light-emitting layer 105 is made of an oxinoid compound, perylene compound, coumarin compound, etc.

<Hole Transport Layer>

The hole transport layer 106 transports holes injected from the anode 108 to the light-emitting layer 105. The hole transport layer 106 is made of a triazole derivative, an oxadiazole derivative, etc.

<Hole Injection Layer>

The hole injection layer 107 promotes injection of holes from the anode 108 to the hole transport layer 106. The hole injection layer 107 is made of metal oxide, metal nitride, or metal oxynitride such as MoOx (molybdenum oxide), WOx (tungsten oxide) and MoxWyOz (molybdenum tungsten oxide).

<Anode>

The anode 108 injects holes to the hole injection layer 107. The anode 108 is made of Ag (silver), Al (aluminum), silver-palladium-copper alloy, silver-rubidium-gold alloy, MoCr (molybdenum-chrome alloy), NiCr (nickel-chrome alloy), ITO (indium tin oxide), IZO (indium zinc oxide), or the like.

In a bottom emission type organic EL element that emits light from a surface closer to the substrate, light-transmissive material such as ITO and IZO is used to form the anode 108.

In a top emission type organic EL element that emits light from a surface closer to the cathode, light-reflective material is used to form the anode 108.

Note that in a top emission type organic EL element, a reflective electrode may be disposed between the anode 108 and the substrate 109.

<Substrate>

The substrate 109 is a base member for the organic EL element. The organic EL element is manufactured by sequentially layering the anode, the organic functional layers and the cathode on the substrate 109. The substrate 109 is made of one of insulating materials such as alkali-free glass, soda glass, nonfluorescent glass, phosphate glass, borate glass, quartz, acrylic resin, styrenic resin, polycarbonate resin, epoxy resin, polyethylene, polyester, silicone resin, and alumina.

<Other>

While not shown in FIG. 1, a passivation layer is disposed on the cathode 101 in order to prevent the organic functional layers from deteriorating in reaction to moisture and air. In a top emission type organic EL element, the passivation layer is made of light-transmissive material such as SiN (silicon nitride) and SiON (silicon oxynitride).

This concludes the description of the structure of the organic EL element pertaining to Embodiment 1.

[Method of Manufacturing Organic EL Element]

Figure 2:
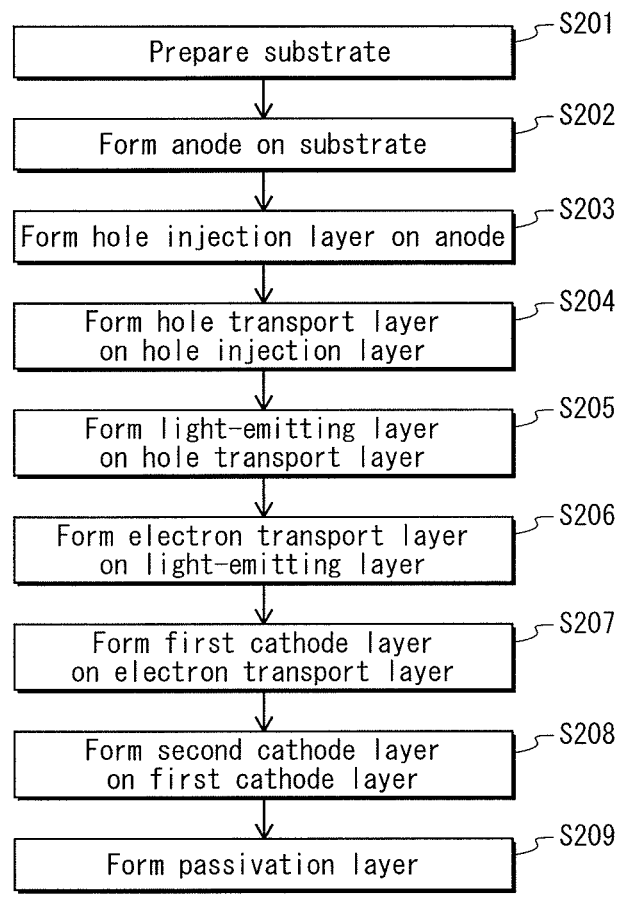
FIG. 2 is a flowchart showing a manufacturing process of an organic EL element.

Next, description is made on a method of manufacturing an organic EL element pertaining to Embodiment 1. FIG. 2 is a flowchart showing a manufacturing process of the organic EL element pertaining to Embodiment 1.

As shown in FIG. 2, the substrate 109 is prepared as a base member for the organic EL element (step S201), and the anode 108 is foimed on the substrate 109 (step S202). The anode 108 is formed by the vapor deposition method or the sputtering method, for example.

Next, a plurality of organic functional layers are formed on the anode 108 (steps S203 through S206).

To be specific, the hole injection layer 107 is first formed on the anode 108 (step S203). After the formation of the hole injection layer 107, the hole transport layer 106 is formed on the hole injection layer 107 (step S204). After the formation of the hole transport layer 106, the light-emitting layer 105 is formed on the hole transport layer 106 (step S205). After the formation of the light-emitting layer 105, the electron transport layer 101 is formed on the light-emitting layer 105 (step S206). These organic functional layers are formed by the vapor deposition method or a coating method using an inkjet apparatus, for example.

After the formation of the organic functional layers, the cathode 101 is formed on the electron transport layer 104 (steps S207, S208).

The step of forming the cathode includes the first film-forming step (step S207) and the second film-forming step (step S208). In the first film-forming step, the first cathode layer 102 is formed on the electron transport layer 104 by the magnetron sputtering method. In the second film-forming step, the second cathode layer 103 is formed by a method different from the magnetron sputtering method on the first cathode layer 102, which has been formed in the first film-forming step. The different method is the facing target sputtering method, plasma deposition method, and the like. The first film-forming step and the second film-foiming step are described in detail later.

After the formation of the cathode, the passivation layer is formed on the cathode 101 (step S209).

As described above, the organic EL element is manufactured by sequentially forming the anode, the organic functional layers and the cathode on the substrate 109.

[Details on First Film-Forming Step of Cathode]

Next, the details on the first film-forming step of the cathode are provided below. The first cathode layer 102 is formed on the electron transport layer 104 by the magnetron sputtering method.

Figure 3:
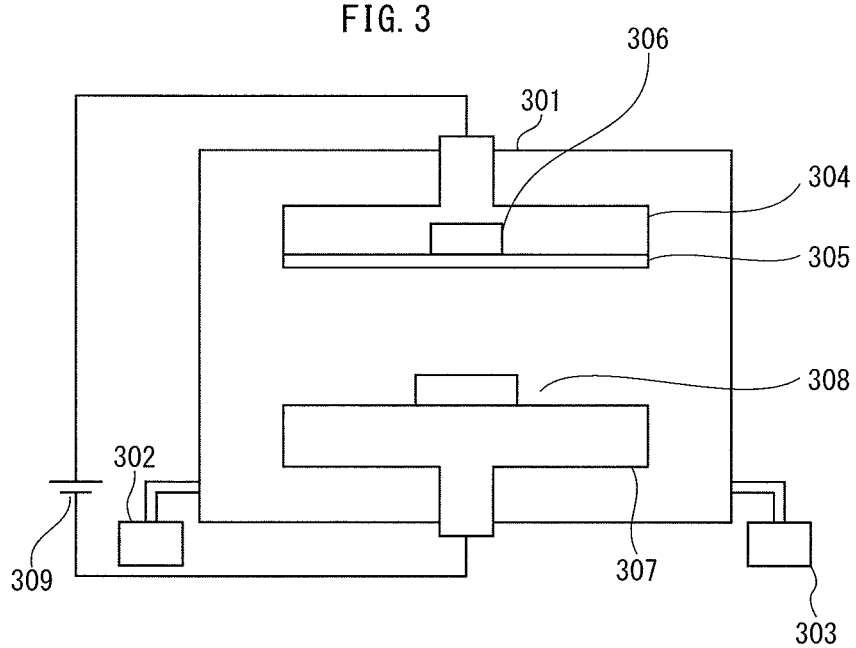
FIG. 3 shows the structure of a magnetron sputtering device 300.

FIG. 3 shows the structure of a magnetron sputtering device 300. As shown in FIG. 3, the magnetron sputtering device 300 includes a sputtering chamber 301, a gas supply system 302, an exhaust system 303, a backing plate 304, a target 305, a magnet 306, a mount 307, a film-forming substrate 308, and a power source 309.

The sputtering chamber 301 included in the magnetron sputtering device 300 is a chamber within which sputtering is performed.

The sputtering chamber 301 is connected to the gas supply system 302 and the exhaust system 303. The gas supply system 302 supplies a sputtering gas, and the exhaust system 303 reduces pressure in the sputtering chamber 301 to a predetermined pressure. The sputtering gas is an inert gas such as argon (Ar).

The mount 307 in the sputtering chamber 301 is provided with the film-forming substrate 308 on which a film is to be formed. The backing plate 304 in the sputtering chamber 301 is provided with the plate-like target 305 that is a film-forming member. On the rear surface of the target 305, the magnet 306 is disposed.

The power source 309 applies voltage to the target 305. Note that in the example shown in FIG. 3, the power source 309 is a DC power source, but may be an AC power source or an AC/DC hybrid power source.

First, the exhaust system 303 evacuates the sputtering chamber 301. Next, the gas supply system 302 supplies the sputtering chamber 301 with a sputtering gas. Then, the power source 309 applies voltage to the target 305. Finally, a sputtering gas plasma is generated to sputter the main surface of the target 305.

The magnet 306 disposed on the rear surface of the target 305 produces the magnetic field parallel to the main surface of the target 305. High-density plasma can be generated near the target by forcing secondary electrons to move with cycloidal motion or trochoidal motion. These secondary electrons are expelled from the surface of the target when ions of the sputtering gas bombard the surface, and trapped by the Lorentz force generated by the magnetic field produced on the surface of the target 305.

The magnetron sputtering method is to form a thin film by using the high energy sputtering particles with the use of the device with the above structure. Since the first cathode layer 102 is formed by the magnetron sputtering method on the electron transport layer 104 in the first film-forming step of the cathode pertaining to the present embodiment, it is possible to form the first cathode layer 102 with high adhesion to the electron transport layer 104.

Here, in the first film-forming step of the cathode, the first cathode layer 102 is preferably formed by the magnetron sputtering method through a high energy process. To be specific, the first cathode layer 102 is preferably formed by the magnetron sputtering method with the film-forming power density no less than 4.5 W/cm$^2$ and no greater than 9.0 W/cm$^2$. By forming the first cathode layer 102 by the magnetron sputtering method through a high energy process, adhesion of the first cathode layer 102 to the electron transport layer 104 as the underlayer can be increased, and electron injection performance from the cathode 101 to the electron transport layer 104 can be improved. Note that a film-forming power density represents a film-forming power per unit area of the target. The magnetron sputtering method with high energy is described below.

[Details on Second Film-Forming Step of Cathode]

Next, the details on the second film-forming step of the cathode are provided below. The second cathode layer 103 is formed on the first cathode layer 102 by a method different from the magnetron sputtering method. To be specific, a sputtering method such as the facing target sputtering method, the plasma deposition method, the chemical vapor deposition (CVD) method, a sol-gel method, a vacuum deposition method such as a resistance heating deposition method and an electron beam deposition method, and an ion plating method are used, for example.

Here, the facing target sputtering method is a method of performing sputtering while generating a vertical magnetic field between two targets arranged in parallel to face each other. For this purpose, magnets are placed on the rear surfaces of the targets. Further, the plasma deposition method is a method of forming a thin film by heating and evaporating deposition material with a plasma gun.

In the magnetron sputtering method, high energy sputtered particles bombard the growth surface of a film, and the membrane stress of the thin film formed by the magnetron sputtering method is usually highest among various film-forming methods. Therefore, the membrane stress of the first cathode layer 102 is high. In contrast, in the second film-forming step of the cathode, the second cathode layer 103 having the membrane stress lower than the first cathode layer 102 is formed on the first cathode layer 102 by using a film-forming method different from the magnetron sputtering method.

It is possible to reduce the membrane stress per unit film thickness over the cathode 101 by forming the second cathode layer 103 having the lower membrane stress on the first cathode layer 102, which has the high adhesion to the electron transport layer 104 as the underlayer. It is therefore possible to reduce the occurrence of peeling and cracking of the cathode 101 while keeping high electron injection performance from the cathode 101 to the electron transport layer 104.

[Experiments]

In order to confirm the usefulness of the method of manufacturing an organic EL element and the organic EL element pertaining to the present embodiment, experiments were conducted in terms of electron injection performance and membrane stress of the cathode.

First, ITO electrodes different in film thickness were formed on the electron transport layer by the magnetron sputtering method, and electron injection performance from each ITO electrode to the electron transport layer was examined. To be specific, the following samples were used in the experiments: (1) sample 1 consisting of an IZO electrode of 16 nm, an electron transport layer of 80 nm and an ITO electrode of 35 nm; and (2) sample 2 consisting of an 170 electrode of 16 nm, an electron transport layer of 80 nm and an ITO electrode of 100 nm. Voltage was applied between the electrodes of the samples, and values of the current density were measured.

Both two samples were formed by the magnetron sputtering method under the following film-forming conditions: the film-forming power of 5.4 kW; the atmospheric gas pressure of 0.6 Pa; and Ar/O$_2$ gas flow of 200/10 sccm. If converting the film-forming power to the film-forming power density representing the film-forming power per unit area of the target, the film-forming power density is 9.0 W/cm$^2$.

Figure 4:
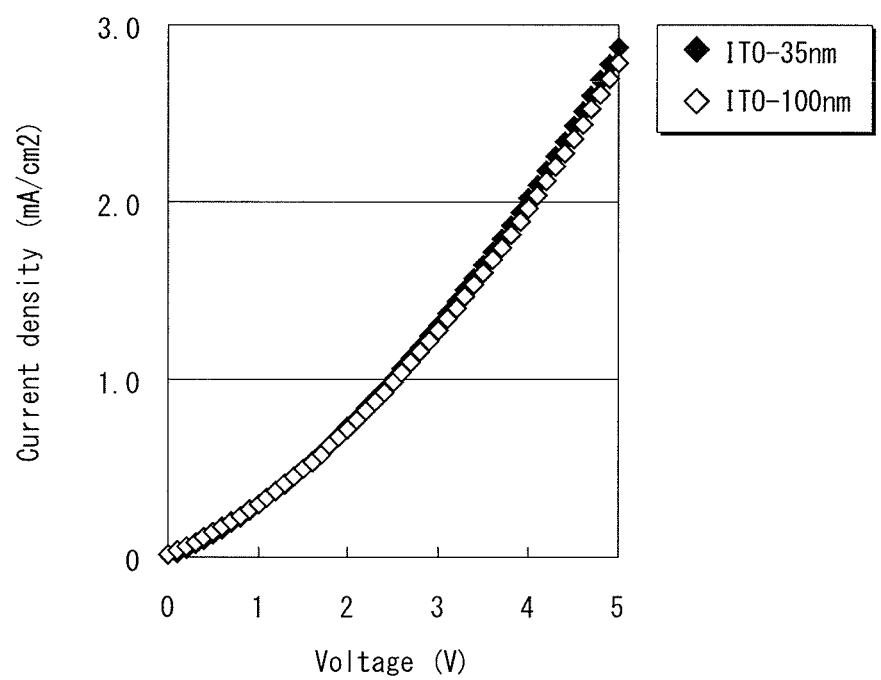
FIG. 4 shows results of the experiment to check for voltage-current density characteristics.

FIG. 4 shows results of the experiment to check for voltage-current density characteristics. The horizontal axis represents the current density (mA/cm$^2$) and the vertical axis represents the applied voltage (V). With reference to the results of the experiment, the voltage-current density characteristics of the sample 1 and the voltage-current density characteristics of the sample 2 are approximately the same. To be specific, when voltage of 3 V is applied, the current density of the sample 1 is 1.30 mA/cm², and the current density of the sample 2 is 1.28 mA/cm². When voltage of 5 V is applied, the current density of the sample 1 is 2.87 mA/cm², and the current density of the sample 2 is 2.79 mA/cm².

The experiment result shows that forming a cathode having a film thickness of 35 nm on the electron transport layer by the magnetron sputtering method suffices to achieve excellent electron injection from the cathode to the electron transport layer. That is, although a cathode having a predetermined thickness is required to be formed for reasons related to the sheet resistance and design, it is not necessarily to form the entire cathode by the magnetron sputtering method. It is possible to obtain excellent electron injection from the cathode to the electron transport layer by forming part of the cathode of approximately 35 nm thick in contact with the electron transport layer by the magnetron sputtering method.

Next, the membrane stress of each ITO electrode formed on the electron transport layer was examined. To be specific, the examinations of the membrane stress were conducted on three samples, i.e., (a) an ITO electrode that was formed by the facing target sputtering method and has a thickness of 100 nm (sample a), (b) an ITO electrode that was formed by the magnetron sputtering method and has a thickness of 100 nm (sample b), and (c) a laminated film formed of an ITO film that was formed by the facing target sputtering method and has a thickness of 10 nm, and another ITO film that was formed on the ITO film by the magnetron sputtering method and has a thickness of 90 nm (sample c).

The ITO film of the sample a was formed by the facing target sputtering method under the following film-forming conditions: the film-forming power of 2.5 kW; the atmospheric gas pressure of 1.0 Pa; and Ar gas flow of 200 sccm with varying $O_2$ gas flow, and the membrane stress was examined.

The ITO film of the sample b was formed by the magnetron sputtering method under the following film-forming conditions: the film-forming power of 2.7 kW; the atmospheric gas pressure of 0.6 Pa; and Ar gas flow of 200 sccm with varying $O_2$ gas flow, and the membrane stress was examined.

Part of the ITO film of the sample c is formed by the facing target sputtering method under the following film-forming conditions: the film-forming power of 2.5 kW; the atmospheric gas pressure of 1.0 Pa; Ar gas flow of 200 sccm; and $O_2$ gas flow of 1 sccm. The remaining part of the ITO film of the sample c is formed by the magnetron sputtering method under the following film-forming conditions: the film-forming power of 2.7 kW; the atmospheric gas pressure of 0.6 Pa; Ar gas flow of 200 sccm; and $O_2$ gas flow of 5 sccm.

Figure 5:
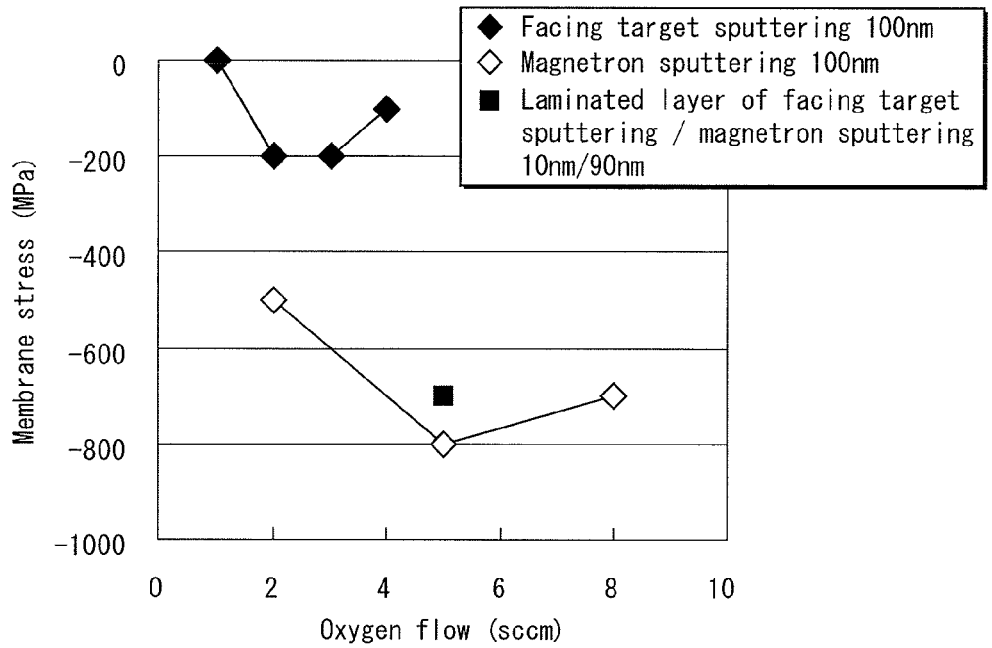
FIG. 5 shows results of measurements of a membrane stress.

FIG. 5 shows results of measurements of the membrane stress. The horizontal axis represents $O_2$ gas flow (sccm), and the vertical axis represents the membrane stress (MPa). The result of the sample c shows the membrane stress that is measured when $O_2$ gas flow represented by the horizontal axis is 5 sccm so as to be compared with the membrane stress of the sample b formed by the magnetron sputtering method. Further, the thin film formed by the magnetron sputtering method shows the compressive stress, and it is indicated that the membrane stress increases as the value along the vertical axis decreases.

According to the experimental results, the membrane stress will be lower when forming an ITO film having a thickness of 10 nm by the facing target sputtering method and another ITO film having a thickness of 90 nm on the ITO film by the magnetron sputtering method, compared to when forming the ITO electrode having a thickness of 100 nm by only the magnetron sputtering method. That is, it can be considered that the membrane stress of the ITO electrode as a whole was reduced by the low membrane stress ITO film layered on the other ITO film by the facing target sputtering method.

Figure 6:
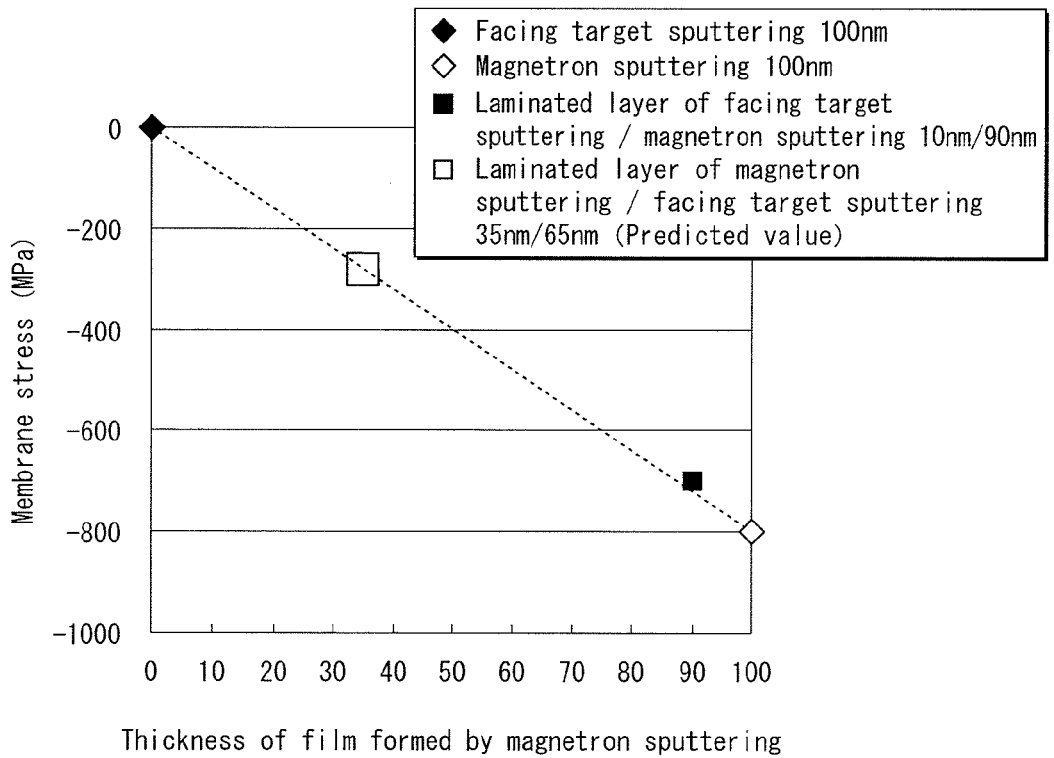
FIG. 6 shows the relationship between the thickness of an ITO electrode formed by the magnetron sputtering method and a membrane stress of the ITO electrode.

FIG. 6 shows the relationship between the thickness of an ITO electrode formed by the magnetron sputtering method and the membrane stress of the ITO electrode. The horizontal axis represents the thickness (nm) of the ITO film formed by the magnetron sputtering method, and the vertical axis represents the membrane stress (MPa) of the ITO electrode. The result represented by the plotted black rhombus corresponds to the sample a formed under $O_2$ gas flow of 1 sccm, which is shown in FIG. 5. The result represented by the plotted white rhombus with a black outline corresponds to the sample b formed under $O_2$ gas flow of 5 sccm, which is shown in FIG. 5. The result represented by the plotted black square corresponds to the sample c shown in FIG. 5.

From the results of the experiment shown in FIG. 5, it is clear that the membrane stress of the whole ITO electrode will be reduced by forming the layer of the lower membrane stress ITO film by the facing target sputtering method. Similarly, it is possible to reduce the membrane stress of the thin film by forming an ITO electrode by the magnetron sputtering method and another ITO electrode by the facing target sputtering method on the ITO electrode.

For this reason, it is thought that the thickness of the ITO electrode formed by the magnetron sputtering method and the membrane stress of the ITO electrode satisfies the relationship indicated by the dotted line in FIG. 6, based on the plot of the black rhombus, the plot of the white rhombus with the black outline and the plot of the black square. That is, it is thought that when the ITO electrode is formed by the magnetron sputtering method and the other ITO electrode is formed on the ITO electrode by the facing target sputtering method, the membrane stress of the whole ITO electrode decreases as the ratio of the thickness of the ITO film formed by the magnetron sputtering method becomes lower and the ratio of the electrode film formed by a method different from the magnetron sputtering method becomes higher.

From the relationship shown in FIG. 6 between the thickness of the ITO electrode formed by the magnetron sputtering method and the membrane stress of the ITO electrode, the membrane stress shown as the plotted white square with the black outline in FIG. 6 can be used as a predicted value of the membrane stress of the ITO electrode consisting of The ITO film formed by the magnetron sputtering method and having a thickness of 35 nm and the ITO film formed by the facing target sputtering method and having a thickness of 65 nm.

The value of the membrane stress indicated by this predicted value shows that the membrane stress is sufficiently reduced. Further, from the results of experiment shown in FIG. 4, it is thought that satisfactory electron injection characteristics are provided. Therefore, it is thought to be possible to form the cathode that exhibits high injection performance to the organic functional layer and has reduced membrane stress.

[Observation of Crystallinity of Cathode]

The first cathode layer 102 and the second cathode layer 103 are formed by different methods, and have different crystalline structures. Here, X-ray diffraction (XRD) was conducted on three samples, i.e., (i) an ITO electrode that was foamed by the plasma deposition method and has a thickness of 100 nm (sample i), (ii) an ITO electrode that was formed by the magnetron sputtering method and has a thickness of 100 nm (sample ii), and (iii) a laminated film formed of an ITO film that was formed by the magnetron sputtering method and has a thickness of 35 nm, and another ITO film that was formed on the ITO film by the plasma deposition method and has a thickness of 65 nm (sample iii), so as to check for crystallinity of each thin film.

Figure 7:
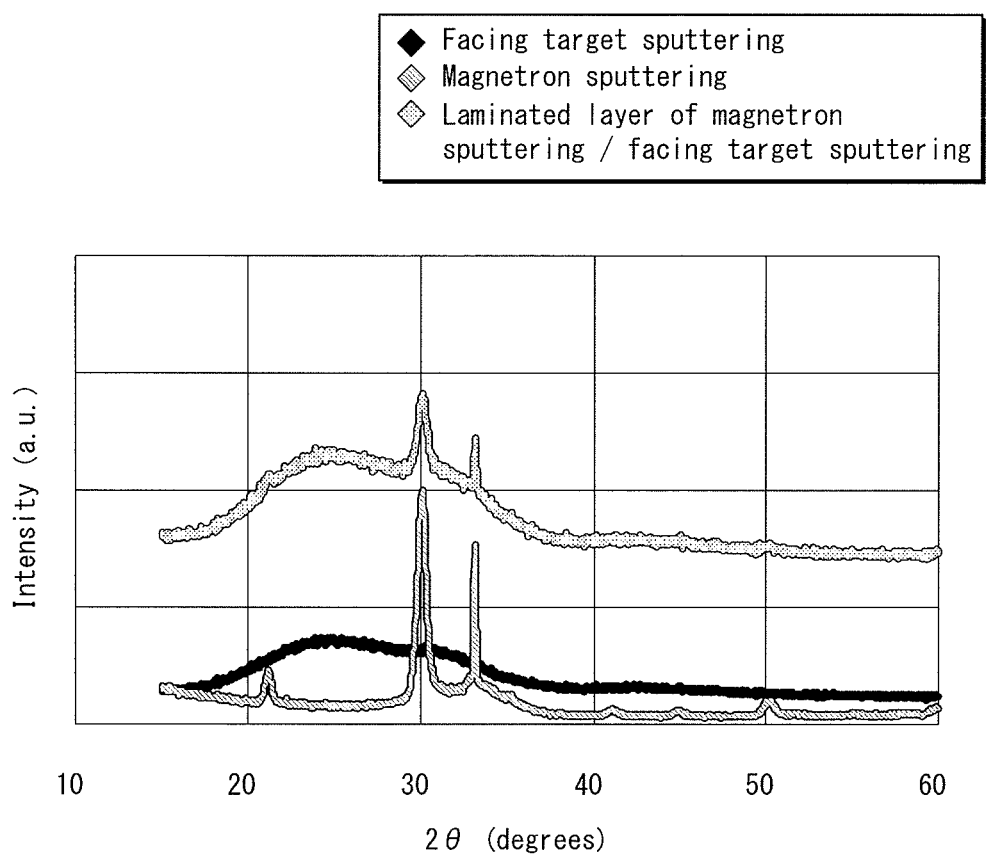
FIG. 7 shows X-ray diffraction patterns.

FIG. 7 shows X-ray diffraction patterns. The horizontal axis represents an angle 2θ (degrees) of a detector, and the vertical axis represents X-ray intensity (a.u.). With reference to the present measurements, the X-ray diffraction pattern of each of the samples ii and iii formed by the magnetron sputtering method shows a clear diffraction peak of the X-ray intensity. This shows that the first cathode layer 102 pertaining to the present embodiment formed by the magnetron sputtering method has the crystalline structure.

The X-ray diffraction pattern of the sample i formed by the plasma deposition method shows a gentle single peak (halo peak). This shows that the second cathode layer 103 pertaining to the present embodiment has the non-crystalline (amorphous) structure.

To summarize the above, it is possible to achieve excellent electron injection to the electron transport layer and to reduce the membrane stress by disposing the first cathode layer 102 having the crystalline structure on the electron transport layer 104 and disposing the second cathode layer 103 having the non-crystalline structure on the first cathode layer 102.

[Magnetron Sputtering Method Through High Energy Process]

In the first film-forming step of the cathode in the method of manufacturing the organic EL element pertaining to the present embodiment, the first cathode layer 102 is preferably formed by the magnetron sputtering method through a high energy process. To be specific, the first cathode layer 102 is preferably formed by the magnetron sputtering method with the film-forming power density no less than 4.5 W/cm$^2$ and no greater than 9.0 W/cm$^2$. The following describes the magnetron sputtering method with high energy.

Considering the deterioration in characteristics of the organic EL element such as the driving efficiency and the life span caused by the damage to the organic functional layers as the underlayer, the vapor deposition method or the low energy sputtering method has been employed in the conventional process of forming the cathode.

In particular, a high energy sputtering method has been avoided in a top emission type organic EL element whose cathode needs to be formed of light-transmissive material such as ITO (indium tin oxide) and IZO (indium zinc oxide), considering the deterioration in characteristics of the organic EL element such as the driving efficiency and the life span caused by the damage to the organic functional layers as the underlayer.

However, when the film is formed by the conventional vapor deposition method or the low energy sputtering method, energy of molecules or atoms adhering to the organic functional layer as the underlayer is low, and accordingly, adhesion between the upper electrode and the organic functional layer as the underlayer is low. Therefore, injection barrier of electrons or holes between the organic functional layers and the electrode is large, and the manufactured organic EL element does not provide satisfactory characteristics in terms of the driving efficiency and the life span.

The inventor evaluated the damage to the electron transport layer caused by forming the ITO film, for example, and considered the possibility of compensating the damage to the electron transport layer caused by forming the ITO film by the high energy sputtering method by increasing adhesion between the ITO electrode and the electron transport layer.

As a result, the inventor has discovered that it is possible to manufacture an organic EL element with high electron injection performance from the cathode to the organic functional layers, high efficiency and a longer life span by forming an ITO film by the magnetron sputtering method in which a large amount of ions enter the substrate through a high energy process, so as to increase adhesion between the organic functional layers and the cathode.

The following describes the forming process of the cathode by the magnetron sputtering method with high energy in more detail with reference to the results of the experiments conducted by the inventor.

First, the inventor formed ITO films on the electron transport layer by the plasma deposition method, the magnetron sputtering method, and the facing target sputtering method, and the ITO films were evaluated. To be specific, evaluations were conducted in terms of the diameter of grains, the work function of each ITO film, and the sheet resistance of each ITO film.

The film-forming electrical power (film-forming power) in the magnetron sputtering method is 5.4 kW, and the film-forming power in the facing target sputtering method is 2.5 kW. If the film-forming power is converted to a film-forming power density representing the film-forming power per unit area of the target, the film-forming power density of the magnetron sputtering method is 9.0 W/cm$^2$.

The atmospheric gas pressure applied in the magnetron sputtering method and the facing target sputtering method is 0.6 Pa, and the atmospheric gas pressure applied in the plasma deposition method is 0.7 Pa.

Figure 8A:
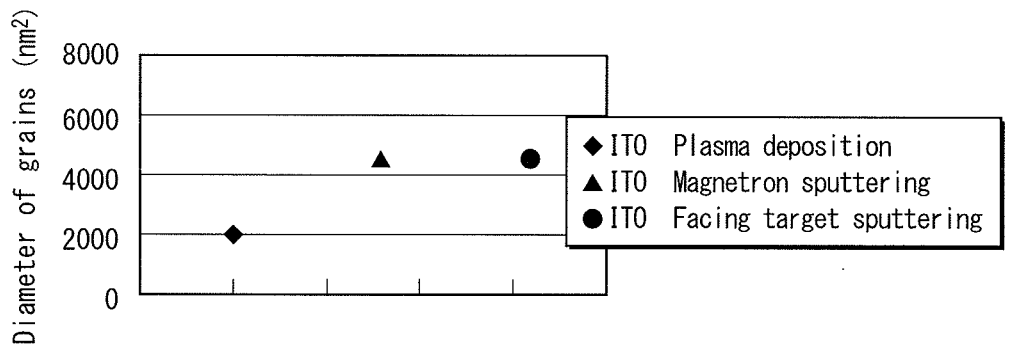
FIGS. 8A-8C show results of evaluation of ITO films formed by different methods.
Figure 8B:
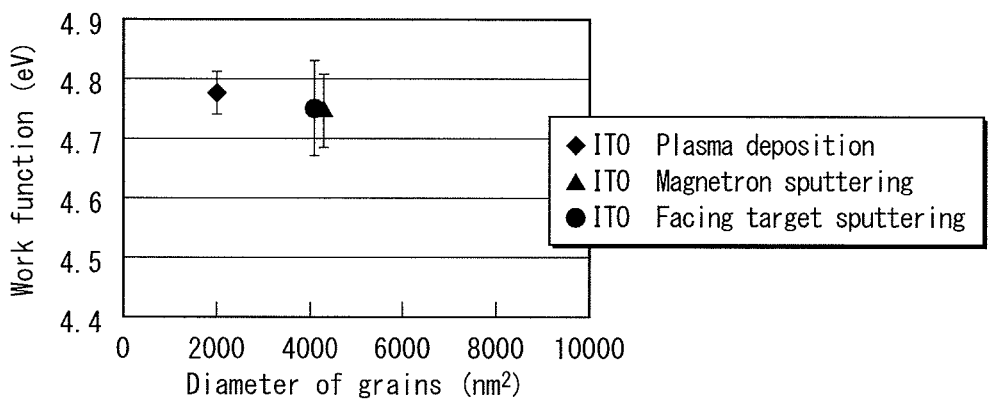
Figure 8C:
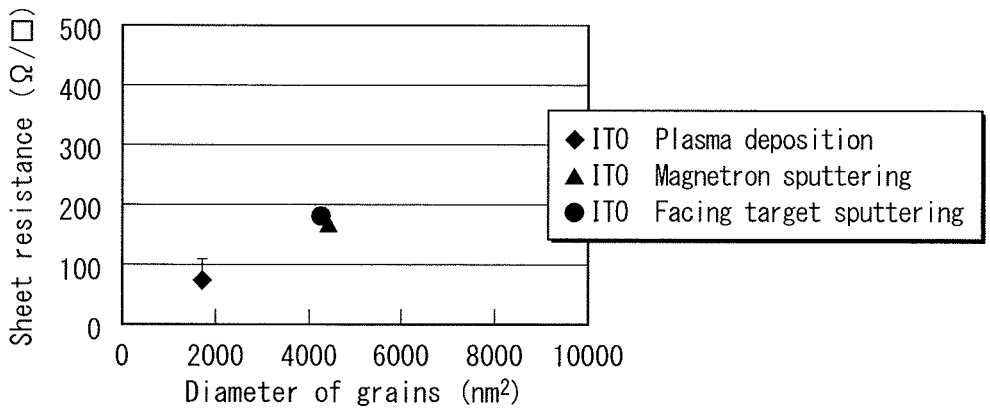

FIGS. 8A-8C show results of evaluation of ITO films formed by different methods. FIG. 8A shows the diameter of grains observed by Scanning Electron Microscope (SEM). FIG. 8B shows the work function of each ITO film. FIG. 8C shows the sheet resistance of each ITO film.

As shown in FIG. 8A, the diameter of grains in the ITO film formed by the magnetron sputtering method is similar to the diameter of grains in the ITO film formed by the facing target sputtering method. The diameter of grains in the ITO film formed by the plasma deposition method is smaller than the diameter of grains in the ITO films formed by the magnetron sputtering method and by the facing target sputtering method.

As shown in FIG. 8B, the work function of the ITO film formed by the plasma deposition method, the work function of the ITO film formed by the magnetron sputtering method, and the work function of the ITO film formed by the facing target sputtering method are similar.

As shown in FIG. 8C, the sheet resistance increases in proportion to the diameter of grains.

Thus, each ITO film was evaluated in terms of the diameter of grains, the work function of the ITO film, and the sheet resistance of the ITO film, and no clear difference was observed among the ITO films formed by the different methods in terms of the work function of the ITO films.

Figure 9A:
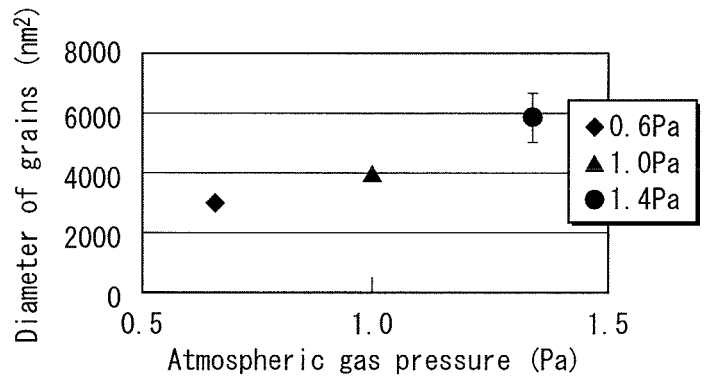
FIGS. 9A-9C show results of evaluation of ITO films formed under different conditions of atmospheric gas pressure.
Figure 9B:
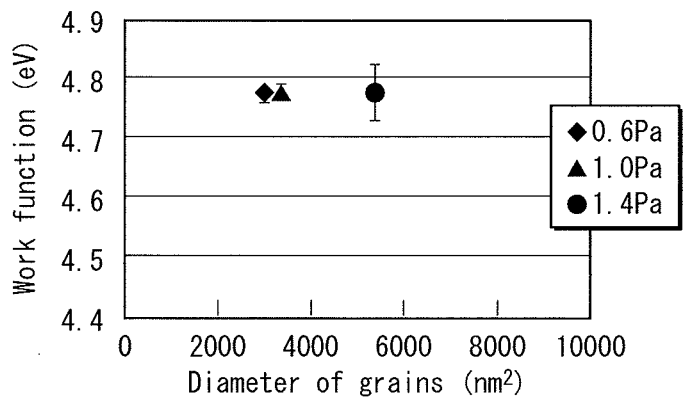
Figure 9C:
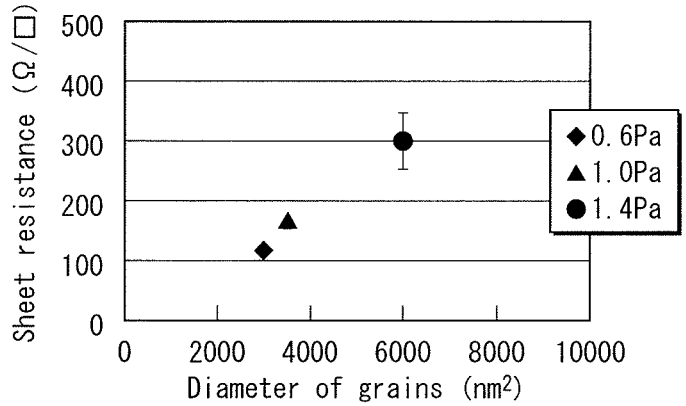

Further, the ITO films were formed by the magnetron sputtering method on the electron transport layer under different conditions of atmospheric gas pressure, and the ITO films were evaluated. FIGS. 9A-9C show results of evaluation of the ITO films formed under different conditions of atmospheric gas pressure. FIG. 8A shows the diameter of grains observed by SEM. FIG. 8B shows the work function of each ITO film. FIG. 8C shows the sheet resistance of each ITO film. Here, ITO films formed in cases where the atmospheric gas pressures are 0.6 Pa, 1.0 Pa, and 1.4 Pa are evaluated.

As shown in FIG. 9A, the diameter of grains in the ITO film increases in proportion to the atmospheric gas pressure.

As shown in FIG. 9B, the work functions of the ITO films formed in cases where the atmospheric gas pressures are 0.6 Pa, 1.0 Pa, and 1.4 Pa are similar.

As shown in FIG. 9C, the sheet resistance increases in proportion to the diameter of grains.

Thus, each of the ITO films formed by the magnetron sputtering method under different conditions of atmospheric gas pressure was evaluated in terms of the diameter of grains, the work function of the ITO film, and the sheet resistance of the ITO film, and no clear difference was observed among the ITO films formed under different conditions of atmospheric gas pressure in terms of the work function of the ITO films.

Further, the transmittance of each of the ITO films formed by the methods and under conditions shown in FIGS. 8A-9C was measured.

Figure 10A:
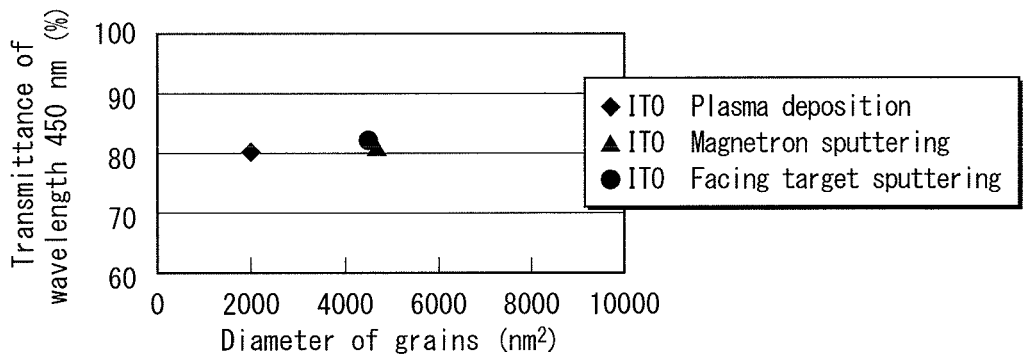
FIGS. 10A-10C show measurements of transmittance of ITO films formed by different methods.
Figure 10B:
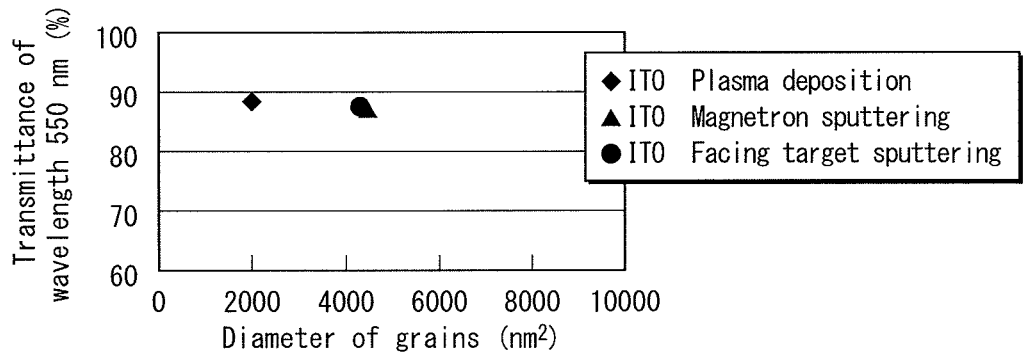
Figure 10C:
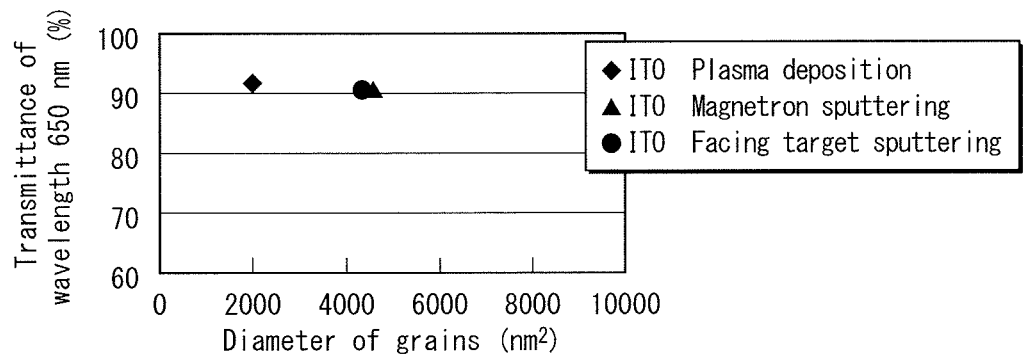

FIGS. 10A-10C show measurements of transmittance of ITO films formed by different methods. FIG. 10A shows the transmittance of light having a wavelength of 450 nm. FIG. 10B shows the transmittance of light having a wavelength of 550 nm. FIG. 10C shows the transmittance of light having a wavelength of 650 nm. The ITO films are formed by the plasma deposition method, the magnetron sputtering method, and the facing target sputtering method under the same conditions as those shown in FIGS. 8A-8C.

As shown in FIGS. 10A-10C, in every wavelength, the transmittance of the ITO films formed by different methods is the same.

Figure 11A:
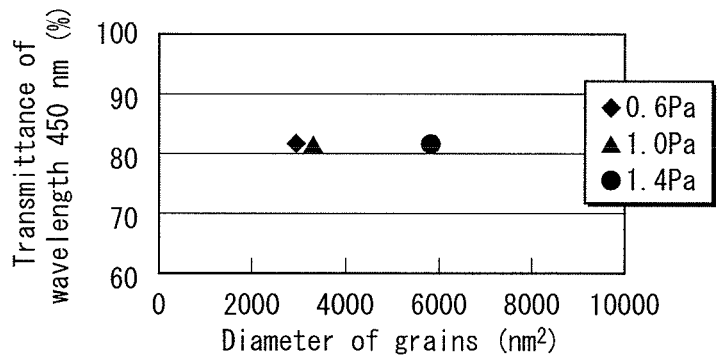
FIGS. 11A-11C show measurements of transmittance of ITO films formed under different conditions of atmospheric gas pressure.
Figure 11B:
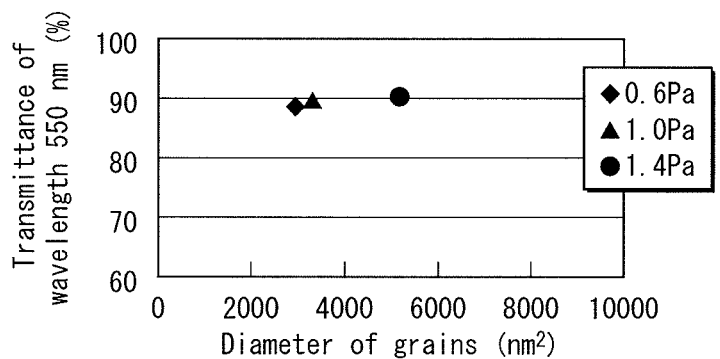
Figure 11C:
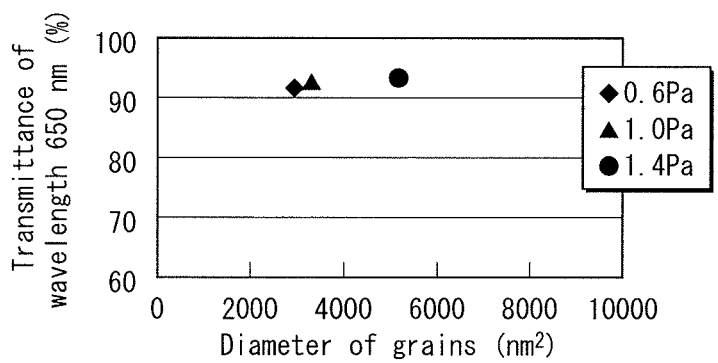

Further, FIGS. 11A-11C show measurements of transmittance of ITO films formed under different conditions of atmospheric gas pressure. FIG. 11A shows the transmittance of light having a wavelength of 450 nm. FIG. 11B shows the transmittance of light having a wavelength of 550 nm. FIG. 11C shows the transmittance of light having a wavelength of 650 nm. Here, transmittance of ITO films formed by the magnetron sputtering method under the same conditions shown in FIGS. 9A-9C in cases where the atmospheric gas pressures are 0.6 Pa, 1.0 Pa, and 1.4 Pa is evaluated.

As shown in FIGS. 11A-11C, in every wavelength, the transmittance of the ITO films formed under different conditions of atmospheric gas pressure is the same.

Further, damage to the organic functional layers as the underlayer caused by forming an ITO film was evaluated by X-ray Photoelectron Spectroscopy (XPS). To be specific, in order to evaluate damage to the organic functional layers, an Alq3 (tris(8-hydroxyquinolinato)aluminium) film of 5 nm was formed by vapor deposition on a glass substrate, and ITO films of 35 nm were formed on the Alq3 film by the plasma gun deposition method, the magnetron sputtering method or the facing target sputtering method. Subsequently, the Alq3 film was removed from the glass substrate, and the interface of the Alq3 film and the ITO film was analyzed by XPS. Also, an aluminum (Al) film of 120 nm was formed by vapor deposition on the Alq3 film and the interface of the Alq3 film and the Al film was analyzed by XPS. For comparison, an Alq3 film without an ITO film was analyzed by XPS. Note that Alq3 is generally used as material of the electron transport layer of an organic EL element.

Figure 12A:
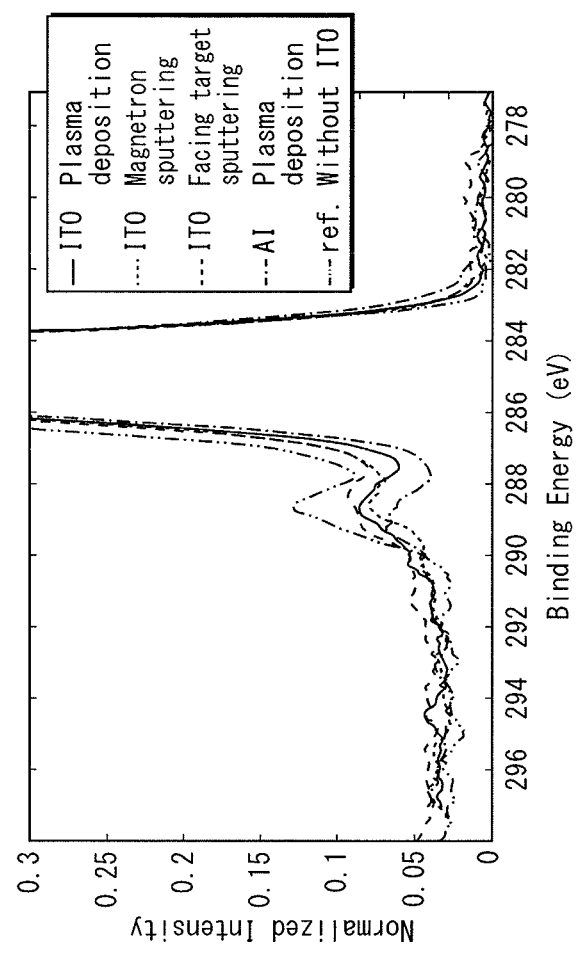
FIGS. 12A and 12B show results of XPS analysis of interfaces between Alq3 films and their respective ITO films.
Figure 12B:
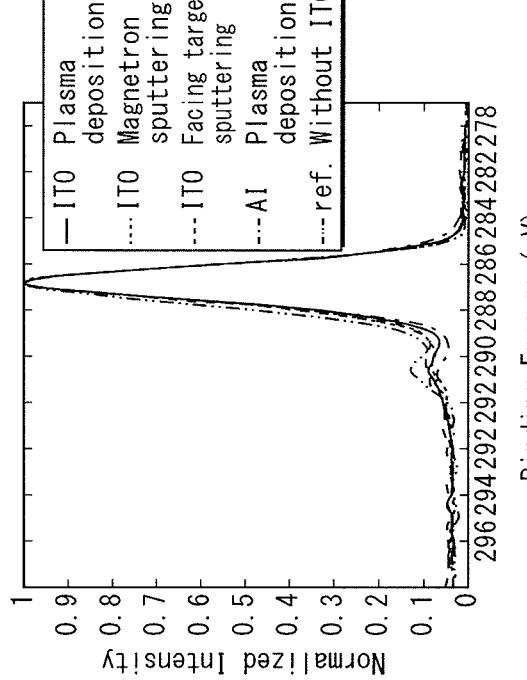

FIGS. 12A and 12B show results of XPS analysis of interfaces between Alq3 films and their respective ITO films. FIG. 12A shows results of comparison of C1s spectra. FIG. 12B is an enlarged figure of the results of comparison of C1s spectra shown in FIG. 12A.

As shown in FIGS. 12A and 2B, similar reduction in the spectral peak was observed around the binding energy of 288-290 ev, for each of the ITO films formed by the plasma deposition method, the magnetron sputtering method and the facing target sputtering method. Such a reduction in the spectral peak is considered to be caused by the damage to the Alq3 film during the foaming process of the ITO film, but no clear difference was observed among spectra due to different methods of forming ITO films.

Further, a ratio of components of the formed film was calculated by performing peak fitting on each spectrum. Samples are (1) an ITO film of 2 nm formed by the plasma gun deposition method on an Alq3 film, (2) an ITO film of 2 nm formed by the magnetron sputtering method on an Alq3 film, (3) an ITO film of 2 nm formed by the facing target sputtering method on an Alq3 film, (4) an Al (aluminum) film of 2 nm formed by vapor deposition on an Alq3 film, and (5) an Alq3 film without ITO film. The following shows the results.

TABLE 1

| Sample | C | N | O | Al | Si | In | Sn |
|---|---|---|---|---|---|---|---|
| Alq3 ITO plasma deposition 2 nm | 48 | 2 | 30 | — | — | 18 | 2 |
| Alq3 ITO magnetron sputtering 2 nm | 47 | 2 | 29 | — | — | 16 | 6 |
| Alq3 ITO facing target sputtering 2 nm | 43 | 2 | 31 | — | — | 17 | 6 |
| Alq3 Al plasma deposition 2 nm | 46 | 2 | 35 | 18 | — | — | — |
| Alq3 without ITO 2 nm | 35 | 2 | 50 | 3 | 10 | — | — |

(atom %)

With reference to the above Table 1, no clear difference was observed among methods of forming ITO films in terms of a ratio of atoms.

The inventor focused on the fact that no clear differences were observed among the methods and conditions when the ITO films and organic functional layers were evaluated as shown in FIGS. 8A-12B and Table 1. Further, the inventor considered the possibility of manufacturing an organic EL element having excellent characteristics in terms of the driving efficiency and the life span by forming an ITO film by the high energy sputtering method, which has been conventionally avoided considering the deterioration in characteristics of the organic EL element such as the driving efficiency and the life span caused by the damage to the organic functional layers as the underlayer, so as to increase adhesion between the ITO layer and the organic functional layers.

Generally, an ITO film is formed by the magnetron sputtering method or the facing target sputtering method. Therefore, the inventor examined which of the magnetron sputtering method and the facing target sputtering method is better to form an electrode on the organic functional layers.

First, the inventor measured the ion current density indicating the amount of ion irradiation of a sputtering gas on the film-forming substrate, and ion energy of the sputtering gas, with the use of plasma diagnostics using a probe method, in cases of the magnetron sputtering method and the facing target sputtering method. Here, the plasma diagnostics using the probe method represents a method of measuring plasma characteristics by inserting a needle-like electrode (probe) in plasma, and measuring current flowing through the probe.

Figure 13:
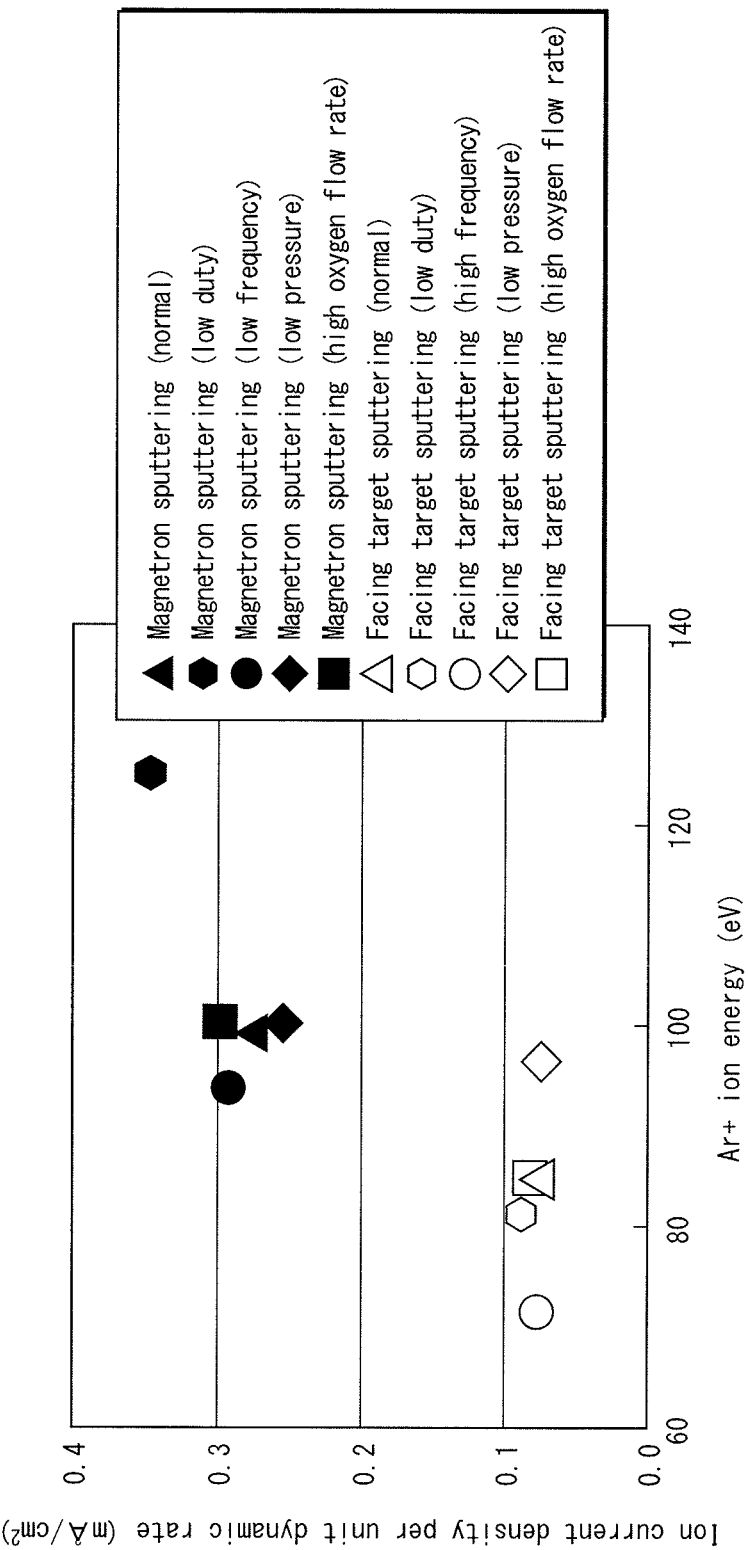
FIG. 13 shows measurements of plasma characteristics.

FIG. 13 shows measurements of plasma characteristics. The following table shows the measurement of plasma characteristics in detail.

TABLE 2

| method | process condition | dynamic rate (Åm/min.) | dynamic rate (nm · m/sec.) | Ar ion energy (eV) | $O_2$ ion energy (eV) | ion current value (mA/cm$^2$) | ion current density per unit rate |
|---|---|---|---|---|---|---|---|
| magnetron sputtering | normal | 911.92 | 1.519866667 | 99.2 | 133.26 | 0.42 | 0.27634 |
| | low duty | 901.1 | 1.501833333 | 125 | 201.73 | 0.53 | 0.35290 |
| | low frequency | 985.11 | 1.64185 | 93.8 | 124.48 | 0.48 | 0.29235 |
| | low pressure | 967.15 | 1.611916667 | 100.3 | 135.76 | 0.41 | 0.25436 |
| | high oxygen flow rate | 944.76 | 1.5746 | 100.4 | 132.09 | 0.47 | 0.29849 |
| facing target sputtering | normal | 79.16 | 0.131933333 | 84.61 | 124.19 | 0.01 | 0.07580 |
| | low duty | 68.15 | 0.113583333 | 81.39 | 134.47 | 0.01 | 0.08804 |
| | high frequency | 76.09 | 0.126816667 | 71.61 | 105.99 | 0.01 | 0.07885 |
| | low pressure | 81.22 | 0.135366667 | 96.39 | 141.28 | 0.01 | 0.07387 |
| | high oxygen flow rate | 75.55 | 0.125916667 | 84.87 | 124.78 | 0.01 | 0.07942 |

Here, plasma characteristics of the film-forming substrate are measured by inserting a probe into a position of the film-forming substrate. The horizontal axis represents collision energy of Ar ion (Ar$^+$ ion energy) against the film-forming substrate. The vertical axis represents ion current per unit dynamic rate. The ion current value represents a current value at which plasma flows into the probe. The ion current value per unit dynamic rate represented by the vertical axis in FIG. 13 indicates an amount of ions entering the film-forming substrate obtained by dividing the ion current value by dynamic rate (film forming speed when the film-forming substrate passes under the target at a transport speed of 1 m/min: Åm/min).

Detailed conditions for each method are shown below.

netron sputtering method under the normal condition, Ar$^+$ ion energies are the same but the ion current densities per unit dynamic rate are three times different. In this case, energy accumulated on the film-forming substrate in the case of the magnetron sputtering method under the normal condition is three times as large as energy accumulated on the film-forming substrate in the case of the facing target sputtering method at low pressure.

When ions of a sputtering gas, i.e., Ar, enter the film-forming substrate, the ions give kinetic energy to sputtering atoms that have adhered to the film-forming substrate. It therefore could be possible that the sputtering atoms that have adhered are accumulated more closely to the organic functional layers, and that a dense thin film is formed.

TABLE 3

| method | condition | distance between target and substrate [mm] | film-forming power [kW] | atmospheric gas pressure [Pa] | gas flow [sccm] Ar | $O_2$ | $H_2O$ | frequency [kHz] | duty ratio [%] |
|---|---|---|---|---|---|---|---|---|---|
| plasma deposition | normal | 800 | 30 | 0.7 | 300 | 35 | 5 | | |
| magnetron sputtering | normal | 80 | 5.4 | 0.6 | 200 | 10 | | 250 | 72.5 |
| | low duty | | | 0.6 | 200 | 10 | | 250 | 60 |
| | low frequency | | | 0.6 | 200 | 10 | | 100 | 73 |
| | low pressure | | | 0.5 | 100 | 6 | | 250 | 72.5 |
| | high oxygen flow rate | | | 0.6 | 200 | 15 | | 250 | 72.5 |
| facing target sputtering | normal | 120 | 2.5 | 0.6 | 200 | 1.5 | | 250 | 72.5 |
| | low duty | | | 0.6 | 200 | 1.5 | | 250 | 60 |
| | high frequency | | | 0.6 | 200 | 1.5 | | 350 | 72 |
| | low pressure | | | 0.2 | 100 | 2.3 | | 250 | 72.5 |
| | high oxygen flow rate | | | 0.6 | 200 | 3 | | 250 | 72.5 |

In the above Table 3, the film-forming power of the magnetron sputtering method is 5.4 kW, and the film-forming power of the facing target sputtering method is 2.5 kW. If converting the film-forming power to the film-forming power density representing the film-forming power per unit area of the target, the film-forming power density of the magnetron sputtering method is 9.0 W/cm$^2$.

The gas flow represents a flowing amount of gas supplied to the sputtering chamber. The frequency represents a pulse frequency of current applied to the target. The duty ratio represents a ratio of positive bias per pulse cycle.

As shown in FIG. 13, in every film-forming condition, the magnetron sputtering method has a greater ion current density per unit dynamic rate indicating an amount of ions entering the film-forming substrate than that of the facing target sputtering method. To be specific, the ion current density of the magnetron sputtering method per unit dynamic rate is no less than 0.2 mA/cm$^2$ and no greater than 0.4 mA/cm$^2$.

For example, when comparing the case of the facing target sputtering method at low pressure and the case of the mag- According to the result of this experiment, in the method of manufacturing the organic EL element pertaining to the present embodiment, the ion current density per unit dynamic rate while forming the upper electrode is preferred to be no less than 0.2 mA/cm$^2$ and no greater than 0.4 mA/cm$^2$.

In the method of manufacturing the organic EL element pertaining to the present embodiment, the inventor focused on the influence the sputtering gas ions entering the film-forming substrate have on the adhesion between the ITO layer and the organic functional layers, and focused on the magnetron sputtering method having greater energy accumulated on the film-forming substrate than the facing target sputtering method.

Here, ITO films were formed by the facing target sputtering method or the magnetron sputtering method under different film-forming conditions, and surfaces of the ITO films were observed by Scanning Electron Microscope (SEM) to examine changes in the surfaces of the ITO films according to film-forming conditions.

FIGS. 14A-14F show SEM images of ITO films formed by the facing target sputtering method. The SEM images in FIGS. 14A, 14B, 14C, 14D and 14F show ITO films formed under the film-forming conditions shown in Table 2. The SEM image in FIG. 14E shows an ITO film formed under the normal film-forming condition shown in Table 2 with the film-forming power halved from 2.5 kw to 1.25 kw.

As shown in FIGS. 14A-14F, in the case of using the facing target sputtering method, particles losing substance were observed when the ITO films were formed under the film-forming conditions except for the normal condition.

FIGS. 15A-15F show SEM images of ITO films formed by the magnetron sputtering method. The SEM images in FIGS. 15A, 15B, 15C, 15D and 15F show ITO films formed under the film-forming conditions shown in Table 2. The SEM image in FIG. 15E shows an ITO film formed under the normal film-forming condition shown in Table 2 with the film-forming power halved from 5.4 kw to 2.7 kw.

As shown in FIGS. 15A-15F, in the case of using the magnetron sputtering method, substructure in which grains are connected to one another is observed in the ITO films formed under every condition, and it is clear that dense thin films are formed.

Also, the crystallinity of ITO films formed by the magnetron sputtering method and the facing target sputtering method was analyzed by X-ray diffraction analysis.

Figure 16:
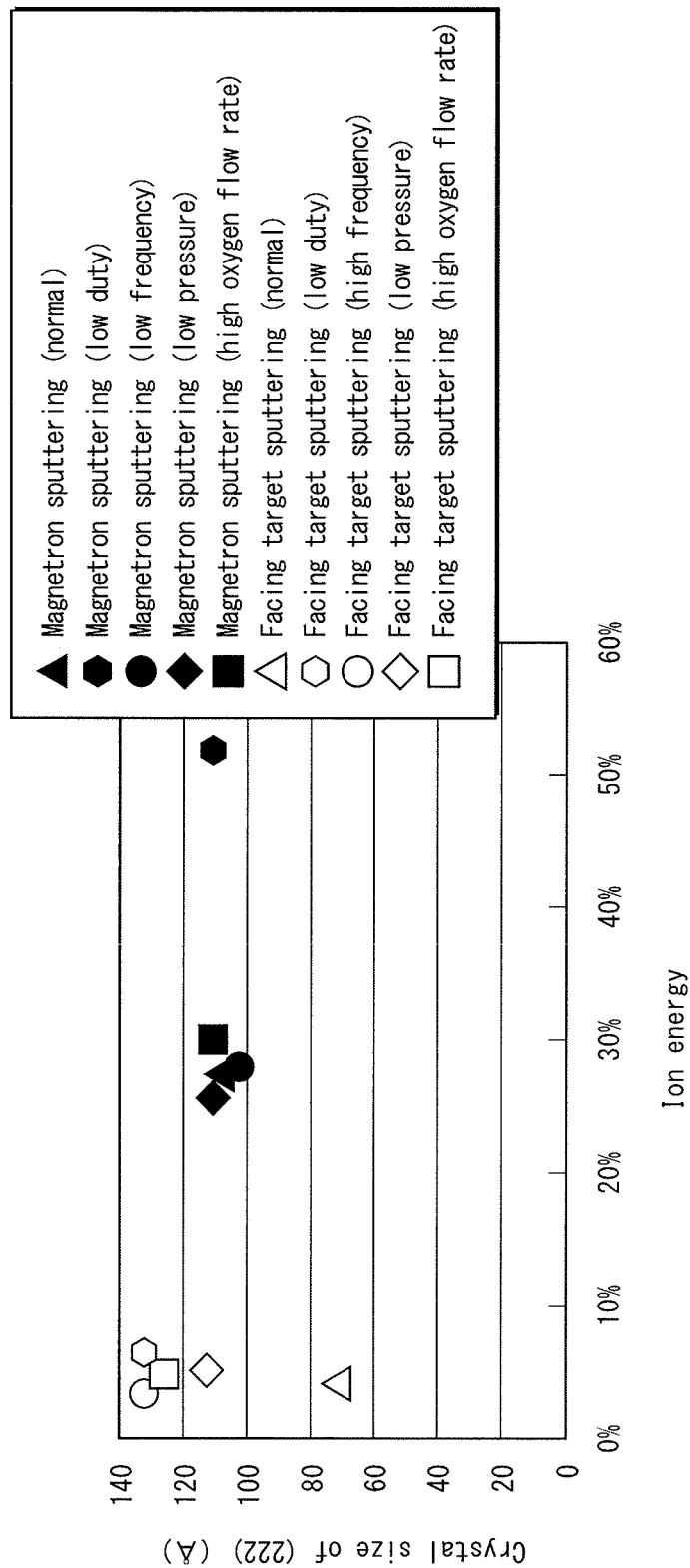
FIG. 16 shows measurements of the sizes of crystals of ITO films.

FIG. 16 shows measurements of the sizes of crystals of ITO films. Here, ITO films were formed by the same sputtering methods under the same film-forming conditions shown in FIG. 13, and the size of crystals were calculated from the full width at half-maximum (FWHM) of the (222) diffraction line by using the Scherrer equation. The following shows the Scherrer equation.

$$D = \frac{0.94\lambda}{\beta \cdot \cos\theta} \quad \text{[Equation 1]}$$

In the above expression, D denotes the size of crystallite, $\lambda$ denotes the X-ray wavelength, $\beta$ denotes peak width, and $\theta$ denotes the Bragg angle of the diffraction line.

As shown in FIG. 16, the ITO films formed by the facing target sputtering method have various sizes of the crystallite according to the film-forming conditions, while the ITO films formed by the magnetron sputtering method have the similar size of the crystallite.

Figure 17:
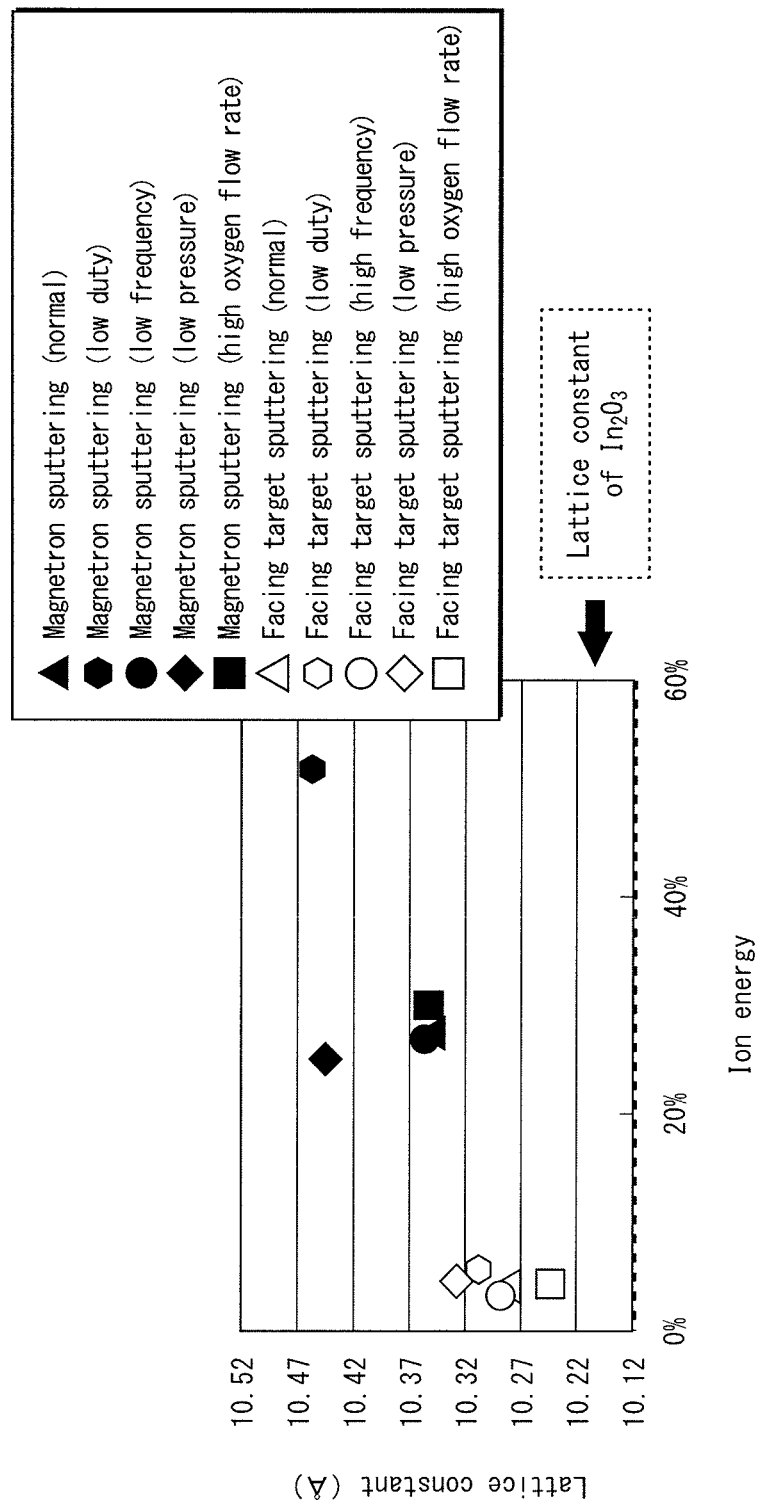
FIG. 17 shows measurements of the lattice constants of crystals of ITO films.

FIG. 17 shows measurements of the lattice constants of crystals of ITO films. Here, ITO films were formed by the same sputtering methods under the same film-forming conditions shown in FIG. 13, and the lattice constants were calculated from the peak position of the (222) diffraction line. An expression used to calculate the lattice constants is as follows.

$$a = d\sqrt{h^2 + k^2 + l^2} \quad \text{[Equation 2]}$$

In the above expression, a denotes a lattice constant, d denotes spacing in the Bragg's law, and h, k and l are the Miller indices.

As shown in FIG. 17, comparing with the lattice constant 10.118 Å of $In_2O_3$, the lattice constants are large in the ITO films formed by the magnetron sputtering method and the facing target sputtering method, and the distortion of crystals of ITO films formed by the sputtering methods was observed. It is clear from this result that the distortion of crystals of the ITO films formed by the magnetron sputtering method is greater than that of the ITO films formed by the facing target sputtering method. It is thought that this results from the fact that an amount of Ar ions entering the film-forming substrate is greater in the case of the magnetron sputtering method.

From results of the aforementioned experiments, the inventor thought that an organic EL element having excellent characteristics in terms of the driving efficiency and the life span can be manufactured by forming the electrode film on the organic functional layers by the magnetron sputtering method in which sputtering gas ions entering the film-forming substrate have greater energy than those in the facing target sputtering method, through a high energy process, so as to increase adhesion between the electrode layer and the organic functional layers. That is, in the first film-forming step of the cathode in the method of manufacturing the organic EL element pertaining to the present embodiment, the first cathode layer 102 is preferably formed by the magnetron sputtering method with the film-forming power density no less than 4.5 W/cm² and no greater than 9.0 W/cm².

Note that the atmospheric gas pressure when forming the upper electrode is preferably no less than 0.4 Pa from a perspective of production time in the method of manufacturing the organic EL element, and is preferably no greater than 1.6 Pa from a perspective from the sheet resistance of the electrode layer. When the atmospheric gas pressure is too high, the sheet resistance of the electrode layer increases.

According to the result of the experiment shown in FIG. 13, the ion current density per unit dynamic rate in the first film-forming step of the cathode is preferably no less than 0.2 mA/cm² and no greater than 0.4 mA/cm².

In order to confirm the usefulness of the magnetron sputtering method with high energy, the driving efficiency and the life span of the organic EL element manufactured by forming the electrode by the magnetron sputtering method through a high energy process were measured.

Figure 18:
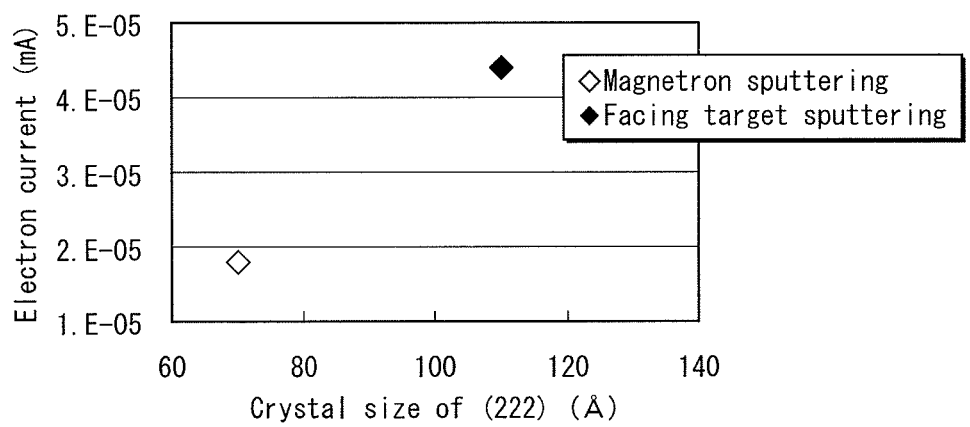
FIG. 18 shows values of currents that flow when a voltage of 5 V is applied to organic EL elements.

FIG. 18 shows values of currents that flow when a voltage of 5 V is applied to the organic EL elements. Each organic EL element was manufactured by forming ITO electrodes on the organic functional layers by the magnetron sputtering method or the facing target sputtering method. Further, the ITO electrodes were formed by the magnetron sputtering method or the facing target sputtering method under the normal film-forming condition shown in Table 3. That is, the film-forming power density of the magnetron sputtering method is 9.0 W/cm².

As shown in FIG. 18, when the same voltage is applied to the organic EL elements, larger current flows through the organic EL element whose ITO film has been formed on the organic functional layers by the magnetron sputtering method through a high energy process. Therefore, it is clear that the organic EL element with the electrode layer formed on the organic functional layers by the magnetron sputtering method through a high energy process exhibits high electron injection performance from the electrode to the organic functional layers, and has satisfactory driving efficiency.

Figure 19:
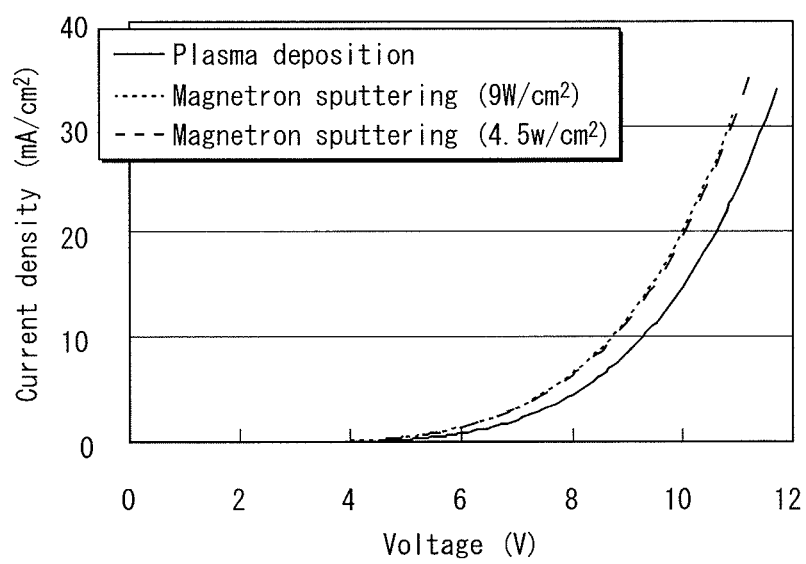
FIG. 19 shows voltage-current density characteristics of organic EL elements.

FIG. 19 shows voltage-current density characteristics of the organic EL elements. The organic EL elements are manufactured by forming the ITO film on the organic functional layers by the plasma deposition method, the magnetron sputtering method with the film-forming power density of 9.0 W/cm², or the magnetron sputtering method with the film-forming power density of 4.5 W/cm². By the plasma gun deposition method and the magnetron sputtering method with the film-forming power density of 9.0 W/cm², the ITO films are formed under the normal film-forming condition shown in Table 1. By the magnetron sputtering method with the film-forming power density of 4.5 W/cm², the ITO film is formed under the normal film-forming condition shown in Table 1 with the film-forming power reduced to the half.

As shown in FIG. 19, it is clear that the organic EL element manufactured by forming the ITO film on the organic functional layers by the magnetron sputtering method with the film-forming power density of 9.0 W/cm$^2$ and the organic EL element manufactured by forming the ITO film on the organic functional layers by the magnetron sputtering method with the film-forming power density of 4.5 W/cm$^2$ exhibit higher electron injection performance from the electrode to the organic functional layers, and have a more satisfactory driving efficiency than the organic EL element manufactured by forming the ITO film on the organic functional layers by the plasma deposition method, which is generally considered to cause low damage.

According to the result of this experiment, the first cathode layer 102 is preferably formed by the magnetron sputtering method with the film-forming power density no less than 4.5 W/cm$^2$ and no greater than 9.0 W/cm$^2$ in the first film-forming step of the cathode in the method of manufacturing the organic EL element pertaining to the present embodiment.

Figure 20:
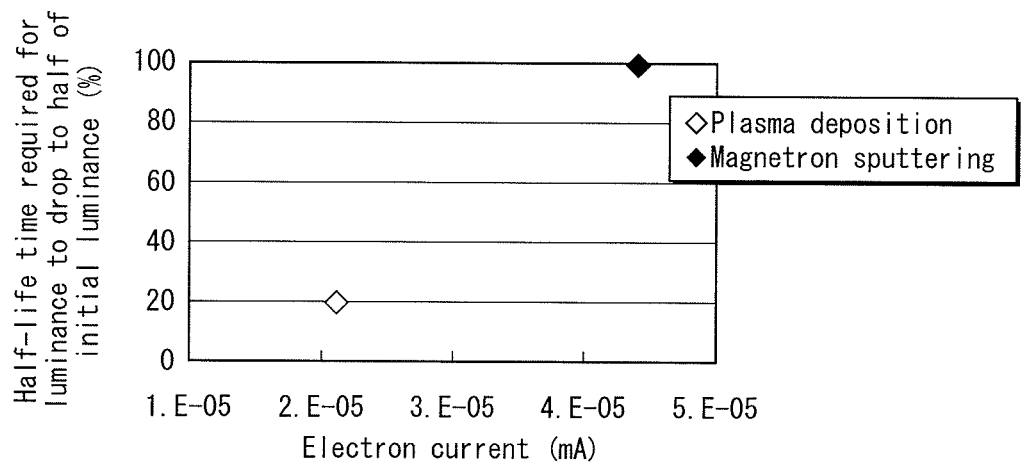
FIG. 20 shows measurements of the half-life time required for luminance of organic EL elements manufactured by forming ITO films on organic functional layers by a plasma gun deposition method or the magnetron sputtering method to drop to half of its initial luminance.

FIG. 20 shows measurements of the half-life time required for luminance of the organic EL elements manufactured by forming the ITO film on organic functional layers by a plasma deposition method or the magnetron sputtering method to drop to half of its initial luminance. The half-life time represented by the vertical axis is standardized by the half-life time of an organic EL element manufactured by forming an ITO film on the organic functional layers by the magnetron sputtering method. The plasma gun deposition and the magnetron sputtering method are used under the normal film-forming condition shown in Table 1. That is, the film-forming power density of the magnetron sputtering method is 9.0 W/cm$^2$.

As shown in FIG. 20, it is clear that the organic EL element manufactured by forming the ITO film on the organic functional layers by the magnetron sputtering method with the film-forming power density of 9.0 W/cm$^2$ has longer life than the organic EL element manufactured by forming the ITO film on the organic functional layers by the plasma gun deposition method, which is generally considered to cause low damage.

Figure 21:
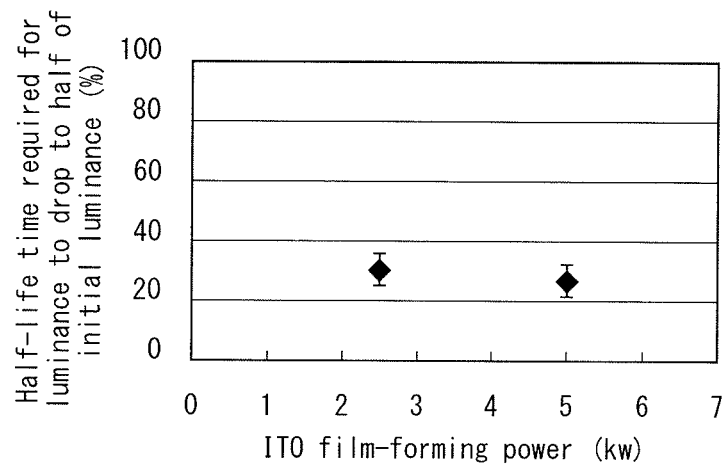
FIG. 21 shows measurements of the half-life time required for luminance of an organic EL element manufactured by forming an ITO film on organic functional layers by the facing target sputtering method to drop to half of its initial luminance.

FIG. 21 shows measurements of the half-life time required for luminance of an organic EL element manufactured by forming an ITO film on organic functional layers by the facing target sputtering method to drop to half of its initial luminance. The half-life time represented by the vertical axis is standardized by the half-life time of an organic EL element manufactured by forming an ITO film on the organic functional layers by the magnetron sputtering method with the film-forming power density of 9.0 W/cm$^2$ shown in FIG. 20. As shown in FIG. 21, it is clear that even if the film-forming power increases, the half-life time of the organic EL element manufactured by forming the ITO film by the facing target sputtering method is not improved. The reason is assumed to be that in the case of the facing target sputtering method, an amount of ions entering the film-forming substrate is not large and it is impossible to increase adhesion between the organic functional layers and the electrode layer, and that therefore electron injection performance from the electrode to the organic functional layers is not improved.

Figure 22:
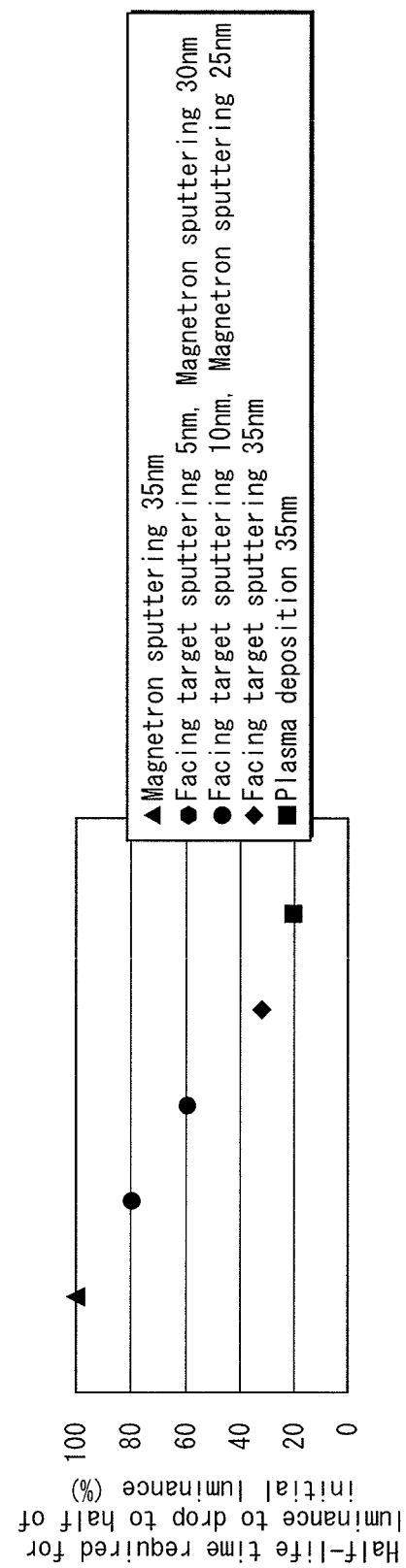
FIG. 22 shows measurements of the half-life time required for luminance of organic EL elements manufactured by forming ITO films on organic functional layers by the magnetron sputtering method, the facing target sputtering method, or the plasma gun deposition method to drop to half of its initial luminance.

FIG. 22 shows measurements of the half-life time required for luminance of organic EL elements manufactured by forming the ITO film on organic functional layers by the magnetron sputtering method, the facing target sputtering method, or the plasma deposition method to drop to half of its initial luminance. The half-life time represented by the vertical axis is standardized by the half-life time of luminance of an organic EL element manufactured by forming an ITO film of 35 nm by the magnetron sputtering method on the organic functional layers.

Samples are (1) an organic EL element having an ITO film of 35 nm formed on the organic functional layers by the magnetron sputtering method, (2) an organic EL element having an ITO film of 5 nm formed on the organic functional layers by the facing target sputtering method, and another ITO film of 30 nm formed on the ITO film by the magnetron sputtering method, (3) an organic EL element having an ITO film of 10 nm formed on the organic functional layers by the facing target sputtering method, and another ITO film of 25 nm formed on the ITO film by the magnetron sputtering method, (4) an organic EL element having an ITO film of 35 nm formed on the organic functional layers by the facing target sputtering method, and (5) an organic element having an ITO film of 35 nm formed on the organic functional layers by the plasma deposition method.

Further, the ITO films were formed by the magnetron sputtering method, the facing target sputtering method, or the plasma deposition method under the normal film-forming condition shown in Table 1. That is, the film-forming power density of the magnetron sputtering method is 9.0 W/cm$^2$.

As shown in FIG. 22, it is clear that the organic EL element having the electrode formed on the organic functional layers by the magnetron sputtering method with the film-forming power density of 9.0 W/cm$^2$ has better lifetime characteristics than those of the organic EL element having the electrode formed on the organic functional layers by the plasma deposition method or the facing target sputtering method.

The reason is assumed to be that since the upper electrode is formed by the magnetron sputtering method in which a large amount of ions enter the organic functional layers through a high energy process, this increases adhesion between the organic functional layers and the upper electrode.

Although faulting the cathode by the magnetron sputtering method through a high energy process causes damage to the organic functional layers as the underlayer, the influence of decrease in injection barrier of electrons due to higher adhesion between the organic functional layers and the upper electrode is greater than increase in injection barrier of electrons due to the damage to the organic functional layers during the forming process of the upper electrode. Therefore, it is possible to manufacture the organic EL element with high electron injection performance from the upper electrode to the organic functional layers, high efficiency and a longer life span.

It is clear that the organic EL element having one electrode formed on the organic functional layers by the facing target sputtering method and another electrode formed on the one electrode by the magnetron sputtering method with the film-forming power density of 9.0 W/cm$^2$ has better lifetime characteristics than those of the organic EL element having an electrode formed on the organic functional layers by only the plasma deposition method or the facing target sputtering method.

This result indicates that an organic EL element having excellent lifetime characteristics can be manufactured by using the magnetron sputtering method with high energy in the process of forming the upper electrode.

As shown in FIG. 19, the organic EL element manufactured by forming the ITO film on the organic functional layers by the magnetron sputtering method with the film-forming power density of 9.0 W/cm$^2$ and the organic EL element manufactured by forming the ITO film on the organic functional layers by the magnetron sputtering method with the film-forming power density of 4.5 W/cm² exhibit substantially the same electron injection performance from the electrode to the organic functional layers. Therefore, it can be thought that the organic EL element manufactured by forming the ITO film on the organic functional layers by the magnetron sputtering method with the film-forming power density of 4.5 W/cm² has excellent lifetime characteristics like the organic EL element manufactured by forming the ITO film on the organic functional layers by the magnetron sputtering method with the film-forming power density of 9.0 W/cm².

SUMMARY

To summarize the above, in the method of manufacturing the organic EL element pertaining to the present embodiment, the cathode thin film is formed on the electron transport layer by the magnetron sputtering method. By doing this, the cathode thin film exhibits high electron injection performance to the electron transport layer. Further, the other cathode thin film is formed by a method different from the magnetron sputtering method on the cathode thin film formed by the magnetron sputtering method. It is possible to form the cathode with the high injection to the organic functional layers and the reduced membrane stress by forming the cathode thin film with the reduced membrane stress on the cathode thin film formed by the magnetron sputtering method.

SUPPLEMENT

While the present invention has been described according to the above embodiment, the present invention is in no way limited to the embodiment. The present invention also includes cases such as the following.

(1) In the above embodiment, the organic EL element includes the cathode, the electron transport layer, the light-emitting layer, the hole transport layer, the hole injection layer, the anode and the substrate. However, the present invention is not limited to this. The organic EL element has only to include a pair of electrodes composed of an upper electrode and a lower electrode, and organic functional layers disposed between the upper electrode and the lower electrode. The organic functional layers may include functional layers that have not described here.

For example, an electron injection layer may be disposed between the cathode and the electron transport layer. The electron injection layer promotes injection of electrons from the cathode to the electron transport layer. The electron injection layer is formed of low-work function metal such as lithium, barium, calcium, potassium, cesium, sodium and rubidium, low-work function metal salt such as lithium fluoride, and a low-work function metal oxide such as barium oxide.

Also, the organic functional layers may not include part of the functional layers described here.

(2) The magnetron sputtering device shown in FIG. 3 is an example, and the magnetron sputtering method pertaining to the present invention is not limited to the method using this device. The magnetron sputtering method is as follows: high-density plasma can be generated near a target by forcing secondary electrons to move with cycloidal motion or trochoidal motion; these secondary electrons are expelled from the surface of the target when ions of a sputtering gas bombard the surface, and trapped by the Lorentz force generated by producing a magnetic field on the target.

INDUSTRIAL APPLICABILITY

The method of manufacturing of an organic EL element according to the present invention can be applied to a method of manufacturing an organic EL display element for use as any type of display device, television, display in a portable electronic device, or the like for home, public, or business use.

REFERENCE SIGNS LIST 100 organic EL element
101 cathode
102 first cathode layer
103 second cathode layer
104 electron transport layer
105 light-emitting layer
106 hole transport layer
107 hole injection layer
108 anode
109 substrate
300 magnetron sputtering device
301 sputtering chamber
302 gas supply system
303 exhaust system
304 backing plate
305 target
306 magnet
307 mount
308 film-forming substrate
309 power source

The invention claimed is:
1. A method of manufacturing an organic EL element, comprising:
   forming a lower electrode on a substrate;
   forming an organic functional layer on the lower electrode; and
   forming an upper electrode on the organic functional layer, wherein the forming an upper electrode on the organic functional layer includes:
      forming a thin film on the organic functional layer by magnetron sputtering, the thin film being formed of material of the upper electrode; and
      forming, after the forming a thin film on the organic functional layer by magnetron sputtering, another thin film by a non-magnetron sputtering film-forming process different from the magnetron sputtering on the thin film formed on the organic functional layer by magnetron sputtering, the another thin film being formed of the material of the upper electrode.
2. The method of claim 1,
wherein the upper electrode is a cathode,
the lower electrode is an anode,
the organic functional layer is composed of a plurality of layers including an electron transport layer, and
in the forming an upper electrode on the organic functional layer, the cathode is formed of light-transmissive conductive material on the electron transport layer.
3. The method of claim 2,
wherein the light-transmissive conductive material is selected from a group consisting of ITO, IZO, ZnO and $TiO_2$.
4. A method of manufacturing an organic EL element, comprising:
   forming a lower electrode on a substrate;
   forming an organic functional layer on the lower electrode; and
   forming an upper electrode on the organic functional layer, wherein the forming an upper electrode on the organic functional layer includes:

forming a thin film on the organic functional layer by magnetron sputtering, the thin film being formed of material of the upper electrode; and forming, after the forming a thin film on the organic functional layer by magnetron sputtering, another thin film by a film-forming process different from the magnet sputtering on the thin film formed on the organic functional layer by magnetron sputtering, the another thin film being formed of the material of the upper electrode, wherein the film-forming process different from the magnetron sputtering is a process to form a thin film having a lower membrane stress than a thin film formed by the magnetron sputtering.

5. The method of claim 4, wherein the film-forming process different from the magnetron sputtering is selected from a group consisting of facing target sputtering, resistance heating deposition, electron beam deposition, CVD, ion plating and plasma deposition.

6. A method of manufacturing an organic EL element, comprising:

forming a lower electrode on a substrate;

forming an organic functional layer on the lower electrode; and forming an upper electrode on the organic functional layer, wherein the forming an upper electrode on the organic functional layer includes:

forming a thin film on the organic functional layer by magnetron sputtering, the thin film being formed of material of the upper electrode; and forming, after the forming a thin film on the organic functional layer by magnetron sputtering, another thin film by a film-forming process different from the magnetron sputtering on the thin film formed on the organic functional layer by magnetron sputtering, the another thin film being formed of the material of the upper electrode, wherein in the forming a thin film on the organic functional layer by magnetron sputtering, a film-forming power density of the magnetron sputtering is no less than 4.5 W/cm$^2$ and no greater than 9 W/cm$^2$.

* * * * *